(12) United States Patent
Sasaki

(10) Patent No.: US 6,772,403 B1
(45) Date of Patent: Aug. 3, 2004

(54) CROSSTALK ANALYSIS METHOD, METHOD FOR DESIGNING/ MANUFACTURING ELECTRONIC CIRCUIT DEVICE BY USING THE SAME, AND RECORDED MEDIUM OF ELECTRONIC CIRCUIT LIBRARY THEREFOR

(75) Inventor: Yasuhiko Sasaki, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/257,674

(22) PCT Filed: Apr. 21, 2000

(86) PCT No.: PCT/JP00/02624

§ 371 (c)(1),
(2), (4) Date: Oct. 15, 2002

(87) PCT Pub. No.: WO01/82145

PCT Pub. Date: Nov. 1, 2001

(51) Int. Cl.[7] ............................................. G06F 17/50
(52) U.S. Cl. .................... 716/6; 716/4; 716/5
(58) Field of Search ................... 716/6, 4, 5

(56) References Cited

U.S. PATENT DOCUMENTS

| | | | | |
|---|---|---|---|---|
| 5,983,006 A | * | 11/1999 | Carlson et al. ................. | 716/4 |
| 6,128,769 A | * | 10/2000 | Carlson et al. ................. | 716/6 |
| 6,389,581 B1 | * | 5/2002 | Muddu et al. .................. | 716/6 |
| 6,449,753 B1 | * | 9/2002 | Aingaran et al. ............... | 716/5 |
| 6,493,854 B1 | * | 12/2002 | Chowdhury et al. ........... | 716/6 |
| 6,507,935 B1 | * | 1/2003 | Aingaran et al. ............... | 716/5 |
| 6,637,014 B2 | * | 10/2003 | Casavant ........................ | 716/6 |

FOREIGN PATENT DOCUMENTS

| | | |
|---|---|---|
| JP | 05-035824 | 7/1991 |
| JP | 07-098727 | 5/1994 |
| JP | 09-062727 | 8/1995 |
| JP | 09-147009 | 11/1995 |
| JP | 11-040677 | 7/1997 |
| JP | 11-154709 | 11/1997 |

OTHER PUBLICATIONS

Sasaki et al., "Multi–aggressor Relative Window Method for Timing Analysis Including Crosstalk Delay Degradation", May 2000, Proceedings of the IEEE 2000 Custom Integrated Circuits Conference, pp. 495–498.*

Sasaki et al., "Building A Crosstalk Library for Relative Window Methods—Timing Analysis that Includes Crosstalk Delay Degradation", Aug. 2000, Proceedings of the Second IEEE Asia Pacific Conference on ASICs, pp. 371–374.*

Yasuhiko Sasaki and Giovanni De Micheli, "Crosstalk Delay Analysis using Relative Window Method", IEEE (1999), pp. 9–13.

* cited by examiner

*Primary Examiner*—Vuthe Siek
*Assistant Examiner*—Sun James Lin
(74) *Attorney, Agent, or Firm*—Reed Smith LLP; Stanley P. Fisher, Esq.; Juan Carlos A. Marquez, Esq.

(57) ABSTRACT

This is a method for more accurately calculating delay times in an electronic circuit device wherein signal arrival times on a victim wire and a plurality of aggressor wires adjacent thereto dynamically vary dependent on an input signal pattern by analyzing values of crosstalk-deriving delay degradation occurring between those wires. By utilizing delay degradation information searchable according to relative signal arrival times between the victim wire and the aggressor wires and adding delay degradations arising between the victim wire and the aggressor wires, calculated at every signal arrival time on the victim wire, the total delay degradation in the presence of a plurality of aggressor wires is calculated. Designing of a high-speed and large-scale electronic circuit device is facilitated and, because a superfluous margin regarding delay times can be eliminated, such electronic circuit devices can be efficiently designed and manufactured.

12 Claims, 21 Drawing Sheets

| VSAT \ ASAT | −0.5 | −0.2 | 0 | 0.2 |
|---|---|---|---|---|
| 0 | 0.02 | 0.08 | 0.13 | 0.08 |
| 0.2 | 0.00 | 0.03 | 0.08 | 0.13 |
| 0.4 | 0.00 | 0.01 | 0.03 | 0.08 |
| 0.6 | 0.00 | 0.00 | 0.00 | 0.03 |

UNIT (ns)

FIG. 3
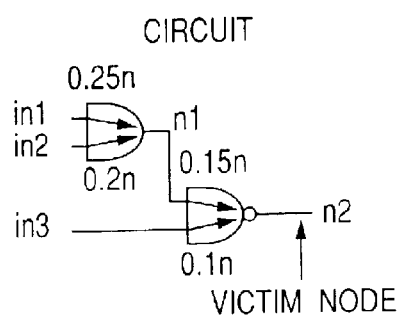
CIRCUIT
CHANGE OF SIGNAL ARRIVAL TIME DEPENDING ON INPUTT PATTERN (SIGNAL PROPAGATION PATH)
| SIGNAL PROPAGATION PATH | SIGNAL ARRIVAL TIME AT n2 POINT |
|---|---|
| in1->n1->n2 | 0.25ns+0.15ns=0.40ns |
| in2->n1->n2 | 0.20ns+0.15ns=0.35ns |
| in3->n2 | 0.10ns |
FIG. 4
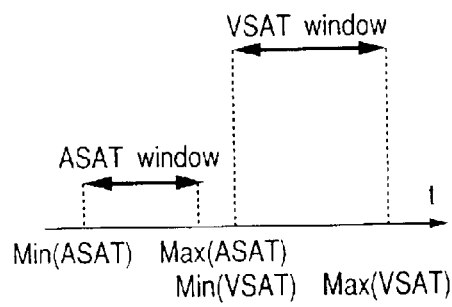
(a) VSAT AND ASAT WINDOW CALCULATION
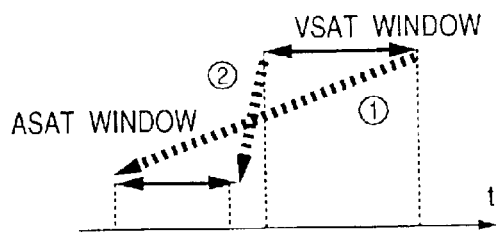
① Min(RSAT)=Min(ASAT)−Max(VSAT)
② Max(RSAT)=Max(ASAT)−Min(VSAT)
(b) RELATIVE WINDOW CALCULATION
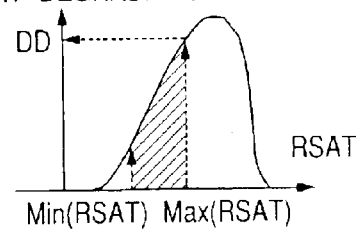
(c) ACQUISITION OF DELAY DEGRADATION

FIG. 5
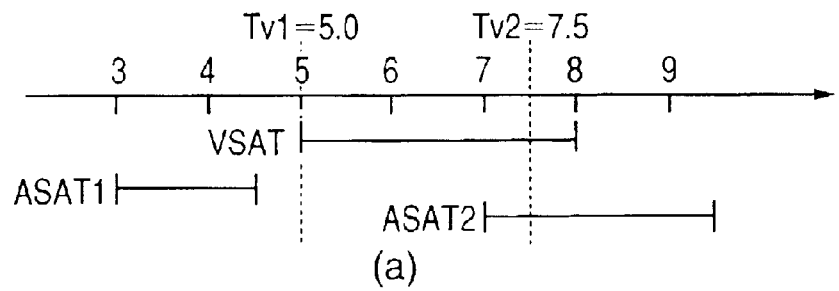
(a)
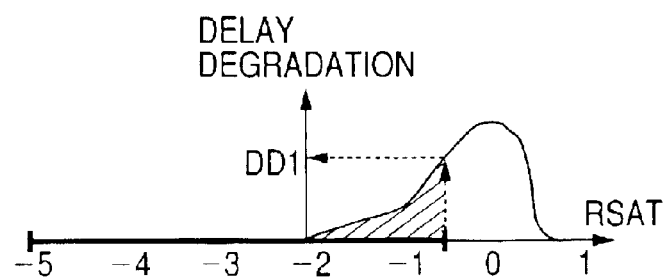
(b) RELATIVE WINDOW 1
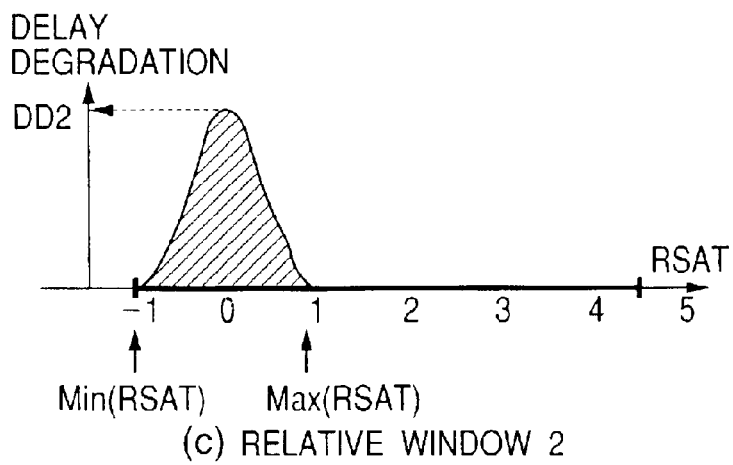
(c) RELATIVE WINDOW 2
$$DD(total) = \Sigma DDi$$
$$= DD1 + DD2$$
DELAY DEGRADATION CALCULATION BY SIMPLE SUM TOTAL
(d)

FIG. 8
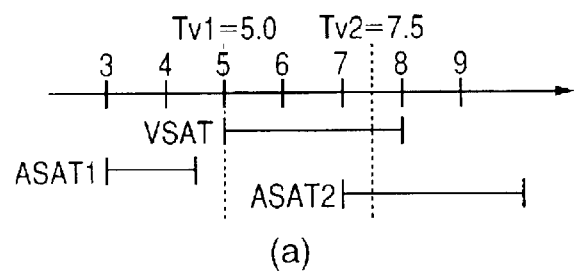
(a)
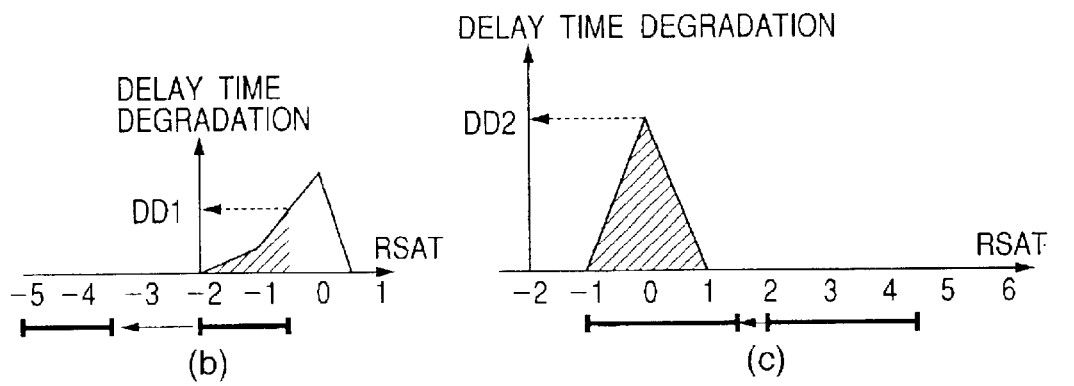
(b)   (c)
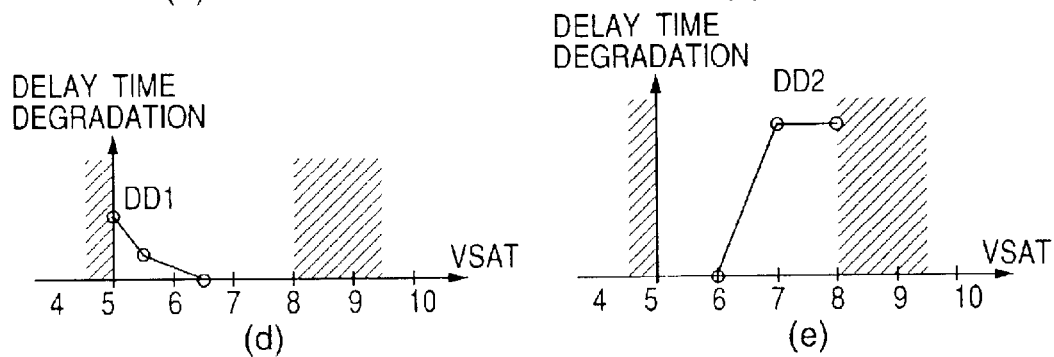
(d)   (e)
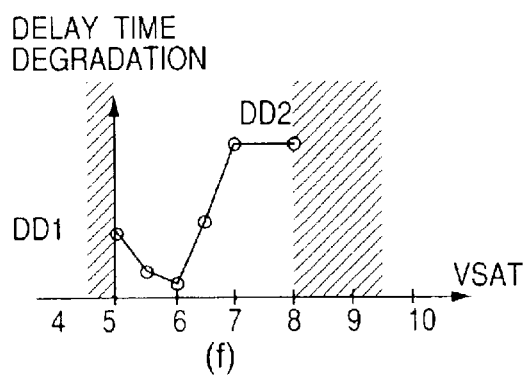
(f)

(a)

(b)

| ADJACENT POINT | ADJACENCY LENGTH |
|---|---|
| 1003–1004 | 500 μm |
| 1003–1005 | 400 μm |

(c)

| GATE | SIGNAL DELAY TIME | |
|---|---|---|
| in1, in2 NAND out | in1 to out | 0.3ns |
| | in2 to out | 0.4ns |
| in1, in2 NOR out | in1 to out | 0.4ns |
| | in2 to out | 0.5ns |
| in1 INV out | in1 to out | 0.3ns |

(d)

| NODE | MINIMUM SIGNAL ARRIVAL TIME | MAXIMUM SIGNAL ARRIVAL TIME |
|---|---|---|
| A | 0.0ns | 0.0ns |
| B | 0.0ns | 0.0ns |
| C | 0.3ns | 0.4ns |
| D | 0.8ns | 0.8ns |
| E | 0.6ns | 1.2ns |
| F | 0.9ns | 1.5ns |
| G | 0.0ns | 0.0ns |
| H | 0.3ns | 0.3ns |
| I | 0.0ns | 0.0ns |
| J | 0.5ns | 0.7ns |
| K | 0.8ns | 1.0ns |
| L | 0.8ns | 0.8ns |
| M | 0.8ns | 0.8ns |
| N | 1.1ns | 1.2ns |

FIG. 14
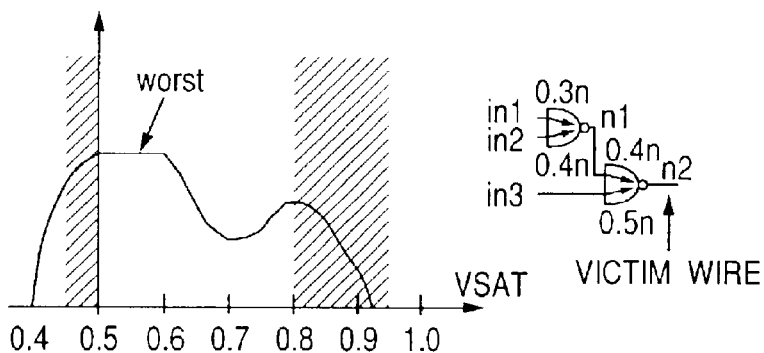
(a)
CIRCUIT MODIFICATION            CIRCUIT MODIFICATION
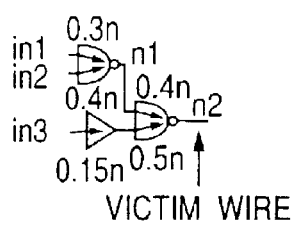    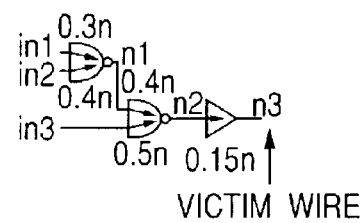
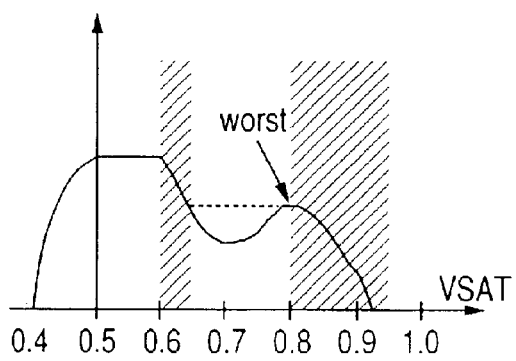    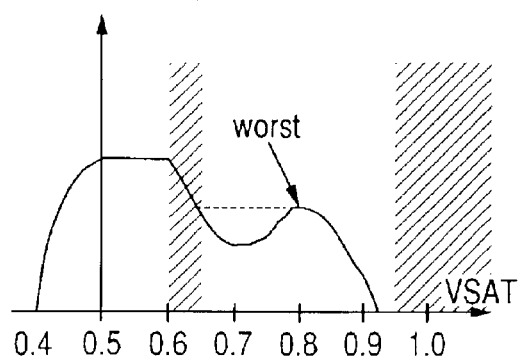
(b)                                  (b)

FIG. 16

(a) VICTIM: NAND2_2 LEVEL OF DRIVABILITY　　AGGRESSOR: NAND2_1 LEVEL OF DRIVABILITY
ADJACENCY LENGTH CONDITION 500μm　　ADJACENCY LENGTH CONDITION 1000μm

| RELATIVE SIGNAL ARRIVAL TIME | DELAY DEGRADATION | RELATIVE SIGNAL ARRIVAL TIME | DELAY DEGRADATION |
|---|---|---|---|
| −300ps | 0.1ps | −500ps | 0.1ps |
| −200ps | 1.0ps | −300ps | 1.0ps |
| −100ps | 5.0ps | −150ps | 5.0ps |
| −50ps | 15.0ps | −75ps | 25.0ps |
| 0ps | 125.0ps | 0ps | 255.0ps |
| 50ps | 10.5ps | 60ps | 15.5ps |
| ⋮ | ⋮ | ⋮ | ⋮ |
| 400ps | 0.3ps | 600ps | 0.5ps |
| 500ps | 0.1ps | 700ps | 0.1ps |

(b) VICTIM: NAND2_1 LEVEL OF DRIVABILITY　　AGGRESSOR: INV_2 LEVEL OF DRIVABILITY
ADJACENCY LENGTH CONDITION 500μm　　ADJACENCY LENGTH CONDITION 1000μm

| RELATIVE SIGNAL ARRIVAL TIME | DELAY DEGRADATION | RELATIVE SIGNAL ARRIVAL TIME | DELAY DEGRADATION |
|---|---|---|---|
| −400ps | 0.1ps | −600ps | 0.1ps |
| −200ps | 0.5ps | −400ps | 0.3ps |
| −100ps | 5.2ps | −200ps | 7.5ps |
| −50ps | 10.0ps | −80ps | 15.0ps |
| 0ps | 55.0ps | 0.5ps | 150.5ps |
| 50ps | 10.5ps | 60ps | 10.5ps |
| ⋮ | ⋮ | ⋮ | ⋮ |
| 400ps | 0.1ps | 600ps | 0.1ps |
| 500ps | 0.0ps | 700ps | 0.0ps |

FIG. 17
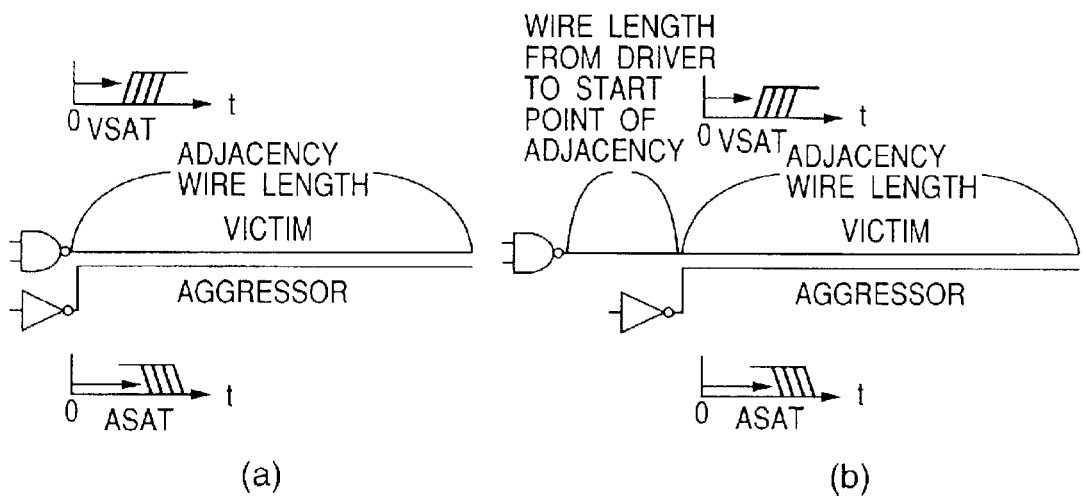
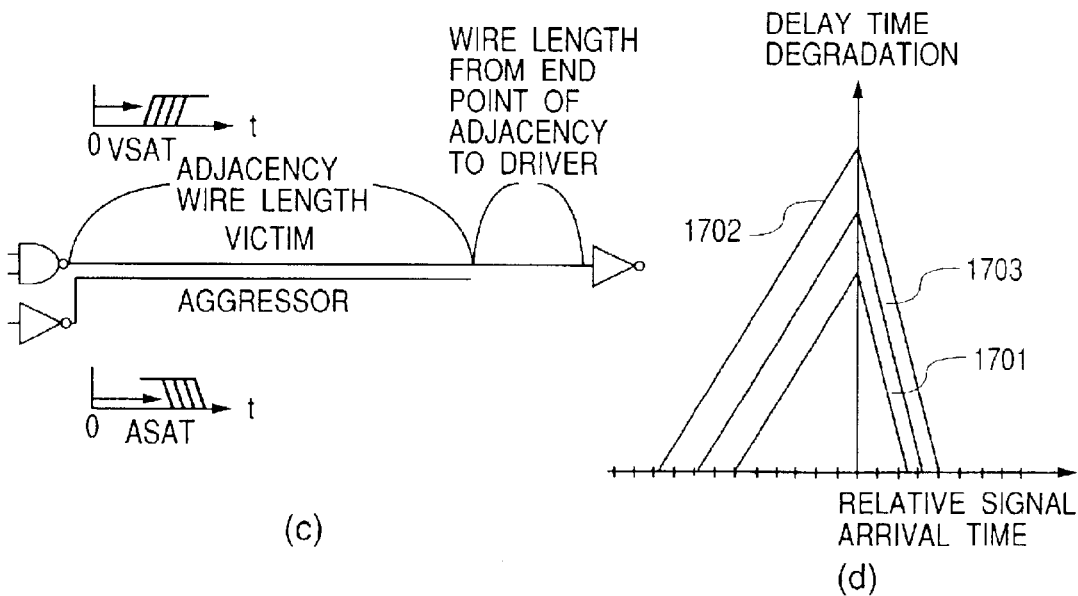

CROSSTALK ANALYSIS METHOD, METHOD FOR DESIGNING/ MANUFACTURING ELECTRONIC CIRCUIT DEVICE BY USING THE SAME, AND RECORDED MEDIUM OF ELECTRONIC CIRCUIT LIBRARY THEREFOR

TECHNICAL FIELD

The present invention relates to an analysis method for crosstalk between many aggressor wires in semiconductor integrated circuit devices and an electronic circuit device having such integrated circuit devices mounted on a printed circuit board or the like, a method for calculating delay times, a method for designing/manufacturing electronic circuit device by using the same, and the like.

BACKGROUND ART

In realizing a logic circuit, there is used up to now a method by which, after arranging large and small electronic circuits known as circuit cells or blocks (also called circuit units), each having a certain logical function, over a semiconductor integrated circuit chip, in a package or over a substrate, the input/output terminals of the cells or blocks are connected using metal wiring.

Since minimizing the area of the semiconductor IC chip, package module or substrate-mounted system to be designed would mean an economic advantage, it is desirable to maximize the integrating density or mounting density of the cells, blocks or wiring. For this reason, in the production of semiconductor integrated circuits, an ever higher degree of fineness has been sought in processing technique and, in respect of mounting techniques, ever greater density has been pursued in mounting within packages or over substrates. However, trying to house many elements or wires in a limited area gives rise to many problems, including one of signal crosstalk.

Signal crosstalk means interference between signals that is apt to arise between a plurality of wires arranged in positions physically close to each other. Generally, integrated circuits and systems are designed to enable the functions to be processed by their circuits to be completed within prescribed lengths of delay time so that they can operate at the target frequency given by the respective specifications.

If they are designed without taking into account the crosstalk mentioned above, the variations in delay time invited by the interference between signals will be overlooked, and this might make it impossible for the semiconductor integrated circuit chips or the systems to operate at their respective target frequencies. To avoid such a consequence, there is needed a method by which delay degradations due to crosstalk can be analyzed precisely.

Such crosstalk analysis methods are disclosed in the Japanese Patent Laid-open No. H7-98727, Japanese Patent Laid-open No. H11-40677 and Japanese Patent Laid-open No. H11-154709.

Although the above-cited methods according to the prior art are effective for crosstalk analysis, they are subject to various constraints in actual application to the designing of a delicate and large-scale electronic circuit device because they are based on limiting conditions, and therefore it is difficult to apply them to the designing of actual, complex electronic circuit devices.

For instance, since there is a constraint on the signal transition time of aggressor wires, it can be mentioned that the signal arrival time of a victim wire and that of an aggressor wire greatly influences the delay time. Another constraint is the dynamic dependence of the arrival time of a signal at each wire on its input pattern, which makes it particularly difficult to calculate accurately and efficiently the delay time due to crosstalk in a high-speed and large-scale electronic circuit device in which a large number of aggressor wires are present.

The present invention is intended to provide a novel crosstalk analysis method for solving these problems, and thereby to make it possible to design and manufacture high-speed and large-scale electronic circuit devices realistically and efficiently.

More specifically, the invention is intended to provide a novel method, for use with high-speed and large-scale electronic circuit devices in which, adjacent to one victim wire, a plurality of other wires are arranged, to calculate accurately and efficiently the crosstalk-deriving complex delay degradation that this plurality of aggressor wires inflict on the victim wire.

DISCLOSURE OF INVENTION

As explained above, what poses difficulty in crosstalk analysis is the dependence of its impact on the signal arrival time.

In view of this point, the present inventors proposed in "Cross-talk Delay Analysis using Relative Window Method," Proceedings of IEEE International ASIC/SOC Conference 1999, pp. 9–13 (hereinafter abbreviated to RWM or referred to as Reference 1), a new analysis method for overcoming these constraints.

Thus, as shown in FIG. 1, the problem is that, depending on the relative timing between the signal arrival time on a wire 3 whose delay time is to be analyzed (hereinafter referred to as victim wire or Victim) (hereinafter referred to as VSAT: victim signal arrival time) and the signal arrival time on a wire 4 interfering with it (hereinafter referred to as aggressor wire or Aggressor) (hereinafter referred to as ASAT: aggressor signal arrival time), the delay time varies in many different ways and thereby invites a delay degradation (hereinafter its magnitude will be referred to as delay degradation value).

Incidentally, here is deliberate taken up a case in which the signals reaching at the respective nodes of wires are in a relationship of out-phase-transition as shown in the left part of FIG. 1. Although there would be no difference in basic idea even if those signals were in a relationship of in-phase-transition, the delay time would be shorter than in the case of out-phase-transition.

In this Reference 1, in considering the influence of the signal arrival time, a relative signal arrival time (hereinafter referred to as RSAT: relative signal arrival time) which is obtained by assessing the ASAT with reference to the VSAT, is used. Here is prepared in advance a graph or table of delay degradation values with the relative signal arrival time RSAT represented on the horizontal axis as shown in FIG. 2 for each combination of drivers for the victim and the aggressor (e.g. NAND gate output drive circuits), and the delay degradation value is calculated for each actual case with reference to this graph or table.

A factor further complicating this problem is that the VSAT and the ASAT themselves dynamically vary, dependent on the input patterns (including paths) of the respective arriving signals. FIG. 3 illustrates this point. For instance, in one type of input pattern variation, whereas the signal is transmitted from an input node in1 to a node n2 via a node n1, the signal arrival time at the n2 point in this case is 0.40 ns. In another type of input pattern variation, however, the signal is transmitted from in3 to n2, and the signal arrival time at the n2 point in this case is 0.10 ns, different from the value mentioned above. Since the RSAT cannot be uniquely determined for this reason, the degradation graph or table such as the one shown in FIG. 2 cannot be simply applied.

The technique proposed in Reference addresses this problem by resorting to a concept known as the relative window.

The method is illustrated in FIGS. 4(a), 4(b) and 4(c). Since the VSAT and the ASAT dynamically vary with the input pattern, neither of them can be obtained as one point of time. Therefore, as shown in FIG. 4(a), the VSAT and the ASAT are calculated as windows each having a range (or width) of time in which a signal has a possibility of actually arriving. The windows will be referred to as the VSAT window and the ASAT window, respectively.

Next, as the RSAT cannot be determined uniquely, instead it is calculated as a window having a width (hereinafter referred to as relative window) as shown in FIG. 4(b). The relative window here means the range from a time when the RSAT is at its minimum to a time when the RSAT is at its maximum. It is when the ASAT is at its minimum and the VSAT is at its maximum that the RSAT is at its minimum. Conversely, the RSAT is at its maximum when the ASAT is at its maximum and the VSAT is at its minimum. Thus, Min (RSAT)=Min (ASAT)−Max (VSAT) and Max (RSAT)=Max (ASAT)−Min (VSAT).

Then, as shown in FIG. 4(c), a quantified delay degradation value can be figured out by obtaining the worst delay degradation value within the relative window RSAT range from the relative window RSAT thereby calculated and the aforementioned degradation graph or table prepared in advance.

The delay degradation value obtained in this way very well agrees with the result of simulation in an actual circuit and is highly accurate.

Incidentally, generally speaking, in the wiring part of a large-scale semiconductor integrated circuit or an electronic circuit device mounted on a substrate there may be more than one aggressor wire per victim wire. In other words, crosstalk may occur between a plurality of aggressor wires and a single victim wire.

However, it has been found that, where there are a plurality of aggressor wires against a single victim wire as stated above, application of the crosstalk analysis technique of Reference 1 would give rise to a problem.

Next, using FIGS. 5(a) through 5(d), this problem will be discussed on the basis of an analysis technique by which the present inventors actually calculated with reference to an example in which there were two aggressor wires against a single victim wire.

FIG. 5(a) shows the signal arrival time ranges of the one victim wire and the two aggressor wires on a time axis. (hereinafter referred to as VSAT, ASAT 1 and ASAT 2, respectively). FIGS. 5(b) and 5(c) show the relationship between the range in which a delay degradation arises between the one victim wire and each aggressor wire (hereinafter referred to as crosstalk range) and the relative window for each of the aggressor wires, with the vertical-axis representing the delay degradation value.

First, the delay degradation value is calculated for each aggressor wire by using the analysis technique of Reference 1 and, from the delay degradation value characteristic diagrams of FIGS. 5(b) and 5(c), DD1 is obtained as the delay degradation value in the worst case between a first aggressor wire (Aggressor 1) and the victim wire (Victim), and DD2, as the delay degradation value in the worst case between a second aggressor wire (Aggressor 2) and the victim wire (Victim).

Next, as shown in FIG. 5(d), the worst delay degradation values obtained for the different aggressor wires are added to find out the total delay degradation value of all the aggressor wires (DD(total)=ΣDDi=DD1+DD2).

While the calculation procedure described above makes possible estimation of the delay degradation value even in the presence of a plurality of aggressor wires, this method involves the following problem.

Thus, the resultant delay degradation value may prove considerably greater than the worst that can really occur. This point will be explained with reference to FIGS. 5 cited above.

It is supposed that here, as shown in FIG. 5(a), Victim and Aggressor 1 give rise to the worst case under the condition of Tv1=5.0 ns and Victim and Aggressor 2 do so under the condition of Tv2=7.5 ns. Simple totalization of the delay degradation values in both worst cases means supposition of the simultaneous occurrence of these two conditions.

Certainly, supposing that the worst cases of the delay degradation value for the two pairs of the victim wire and an aggressor wire do occur at the same time, the total of those delay degradation values would be the worst. In reality, however, these two conditions can never occur at the same time, because Victim is the same wire in the two cases, the signal arrival time VSAT cannot take two unrelated different values at the same time (even if there is a difference in signal propagation time, the different time values cannot be totally unrelated to each other).

This means that the above-described technique, which presupposes that the worst cases can occur at the same time for the two pairs of different aggressor wires and the common victim wire, takes into account what can never occur in reality, and therefore overestimates the delay degradation value. This can pose a serious problem especially where the number of aggressor wires is great.

The present invention is intended to provide a method for analyzing more accurately and efficiently crosstalk-deriving delay degradation values where there are a plurality of aggressor wires and the signal arrival time of each of a victim wire and aggressor wires dynamically varies dependent on input pattern variations (including path variations).

More specifically, the invention is intended to provide a designing technique which makes possible designing and manufacturing of an electronic circuit device with a reduced margin, in figuring out delay degradations due to crosstalk inflicted by a plurality of aggressor wires on a single victim wire, for extra delay time which cannot arise in the operation of any actual electronic circuit.

Some of the typical aspects of the invention disclosed in the present application will be briefly summarized below.

Thus according to the invention, there is provided an analysis method for crosstalk-deriving delay degradations for use where there are a plurality of aggressor wires (Aggressors) against a single victim wire (Victim) and the signal arrival time of each of a victim wire and aggressor wires dynamically varies dependent on input pattern variations (including path variations) (called MA-RWM (Multi-Aggressor Relative Window Method) as distinguished from RWM described above).

In analyzing delay degradations, simple application of the method described in Reference 1 would also involve cases which cannot really occur because the VSAT as the absolute time is not taken into account, but according to the present invention, which excludes from analysis such impossible cases, the delay degradation characteristics which dynamic variations in signal arrival on each aggressor wire bring to bear on a specific victim wire are figured out, these delay degradation are added on the basis of the signal arrival time on the victim wire, and crosstalk in the presence of a plurality of Aggressors is thereby made analyzable with high accuracy.

BRIEF DESCRIPTION OF DRAWINGS

FIG. 3 shows variations in signal arrival time dependent on input pattern variations (signal propagation path variations);

FIGS. 4(a) through 4(c) shows a delay degradation analysis procedure using the RSAT window;

FIGS. 5(a) through 5(d) are diagrams for explaining analysis of crosstalk inflicted on a single victim wire by a plurality of aggressors;

FIGS. 8(a) through 8(f) are drawings for explaining another crosstalk analysis method according to the invention;

FIGS. 14(a) through 14(c) are for describing still another embodiment of the invention;

FIGS. 16(a) and 16(b) are for explaining library information for use in the invention;

FIGS. 17(a) through 17(d) are for describing still another embodiment of the invention;

BEST MODE FOR CARRYING OUT THE INVENTION

A mode for carrying out the present invention in a crosstalk analysis technique as applied to a case in which a plurality of wires are arranged adjacent to a single victim wire will be described with reference to FIG. 6 and FIGS. 7(a) through (f).

Analysis taking into account the signal arrival time VSAT on the victim wire (Victim) makes it possible to find out the worst case of delay degradation by the plurality of aggressor wires (Aggressors) for every realistically possible VSAT, i.e. on the basis of every possible signal arrival time on the victim wire, and to avoid a situation in which a plurality of VSAT that cannot occur at the same time are used.

Figure 6:
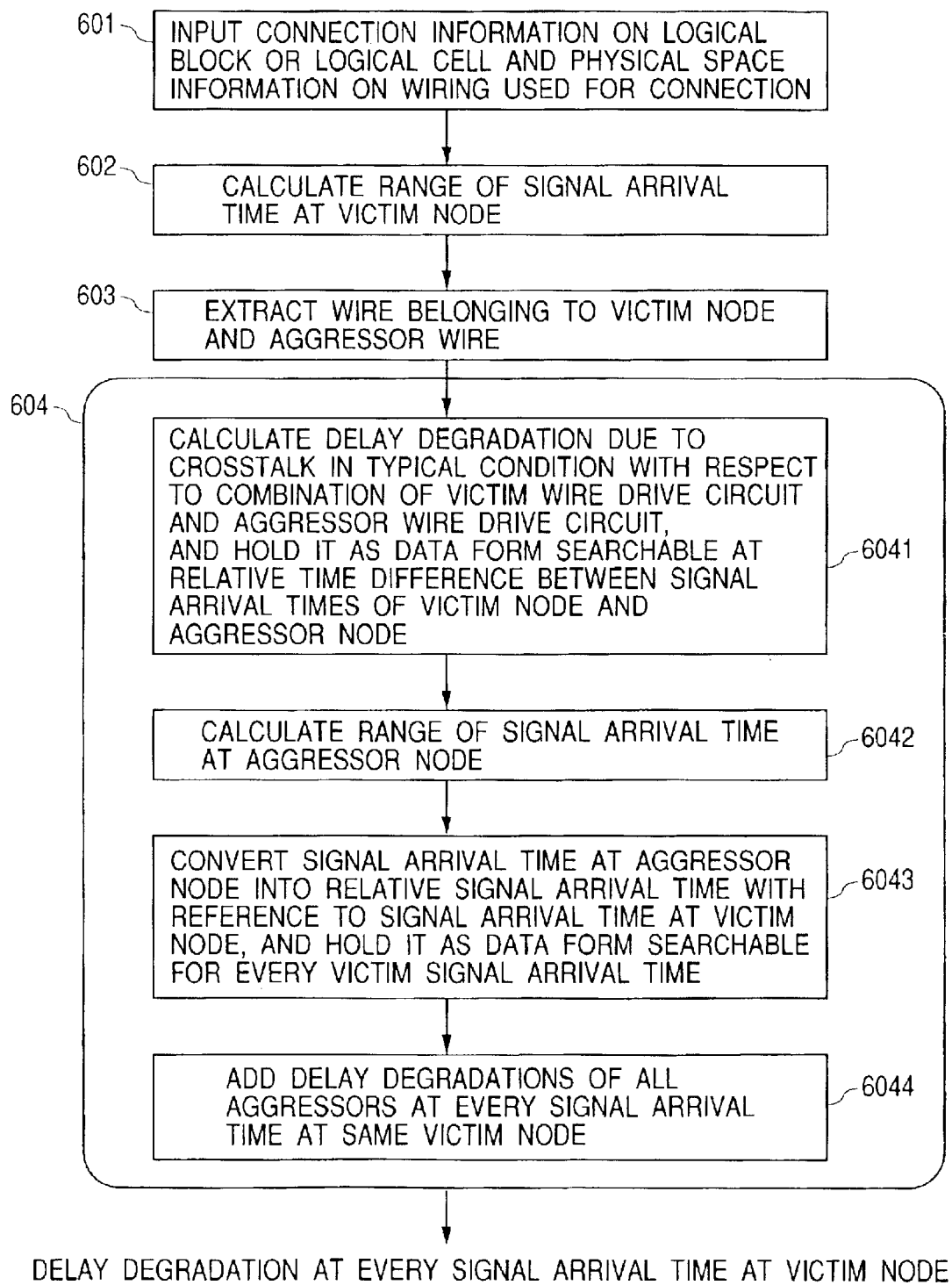
FIG. 6 shows steps of a crosstalk analysis procedure according to the invention.

At a first step, as stated in box 601 of FIG. 6, connection information on logical blocks or logical cells for determining the logical relationship between the logical input and the logical output of the electronic circuit device for analysis and physical space information on the wiring used for their connection are inputted into a delay time calculating system.

Then at a second step, as stated in box 602, in calculating the signal arrival time at one node or more in the logic circuit, the possible range of signal arrival time at the node is calculated The calculation at this step can be accomplished by executing, for instance, the procedure of (b-1) through (b-4) below.

(b-1): A substep to calculate or search for the delay time between the input and output of each logical cell or logical block which a signal passes from a node whose signal arrival time is known until the victim node.

(b-2): A substep to calculate or search for the delay time in the wire parts connecting the logical blocks or logical cells on the same path as that of (b-1) above.

(b-3) A substep to add the total of delay times obtained at substeps (b-1) and (b-2) above to the known signal arrival time which is the starting point of the path to obtain the signal arrival time of the victim node.

(b-4): A substep to calculate the possible range of the signal arrival time of the victim node by executing the substeps of (b-1), (b-2) and (b-3) above on each of the signal propagation paths.

Further at a third step, as stated in box 603 of FIG. 6, the wire belonging to the victim node at the second step above and aggressor wires are extracted from the physical space information on the wiring inputted at the first step above in accordance with a prescribed condition.

As the prescribed condition at this third step, the lengths of adjacent wires, for instance, can be used. It is possible to set the adjacency length smaller where the capacitance coupling and the inductance coupling between the victim wire and the aggressor wires per unit length is greater, or to set the adjacency length greater where the capacitance coupling and the inductance coupling is smaller. Other possible conditions include the strength, i.e. the load drive capacity of the driver circuit for driving the adjacent wires; if the strength is greater than a prescribed level, all the adjacent wires can be deemed to be aggressor wires or, conversely, if the strength of the driver circuit is smaller, the adjacent wires can be deemed not to be aggressor wires.

Then at a fourth step, as stated in box 604 of FIG. 6, using the range of signal arrival time for the victim node obtained by executing the second step above, the following substeps (d-1) through (d-4) are executed to calculate the degradation value at the victim node at the signal arrival time with the influence of possible aggressor wires taken into consideration.

(d-1): A substep to calculate the delay degradation due to crosstalk in a typical (or representative) condition by circuit simulation with respect to the combination of the drive circuit for the aforementioned victim wire and the drive circuit for the aggressor wire extracted at step (c) above, and hold it as a data form searchable at a relative time difference between signal arrival times of the victim node and the aggressor node (box 6041 of FIG. 6).

(d-2): A substep to calculate the range of signal arrival time at the node to which the aggressor wire extracted at step (c) above belongs (box 6042).

(d-3): A substep to convert the range of signal arrival time of the aggressor node calculated at substep (d-2) above into a range of relative signal arrival time with reference to the signal arrival time at the victim node, pick out the maximum value from the delay degradation value data obtained at substep (d-1) above within the range of relative signal arrival time, and hold it as a data form searchable at each signal arrival time at the victim node (box 6043).

(d-4): A substep to add delay degradation values held at substep (d-1) above for the combination of the victim wire and the plurality of aggressor wires at each signal arrival time at the victim node, i.e. with reference to the signal arrival time at the victim node, and hold the resultant sum as the delay degradation value at each signal arrival time at the victim node (box 6044).

It is desirable for substep (d-1) above to be calculated in advance according to the type and strength class of the drive circuit to be used, and store the calculated result in a library form. If such a library is stored in a recording medium on the computer, the data retrieved therefrom can be immediately used when analyzing delay degradations for each individual design. Such a library can be incorporated into data books or the like in silicon foundry services such as so-called standard cell series and gate array series.

It is more likely for a case encountered in actual design work not to be in full agreement with the conditions acquired from the library. Therefore it is preferable for information from the library to be used with appropriate compensations for the conditions encountered. For instance, if the adjacency length in the encountered conditions is a certain multiple (which would be a real multiple, but not necessarily be an integral multiple), the delay degradation value stated in the library can be multiplied by the same multiplier. Such compensations need not be made at the same ratio, but a calculation well fitting a plurality of experimental values can as well be used for compensation.

The condition of acquiring a library need not be only one, but libraries acquired in a plurality of conditions may conceivably be used in combination to simulate the conditions encountered.

Next will be described in more specific terms, with reference to FIGS. 7(*a*) through 7(*f*), a step of calculating a delay degradation value, with VSAT taken into consideration as the absolute time, as stated in (d-2) through (d-4) above.

Figure 7:
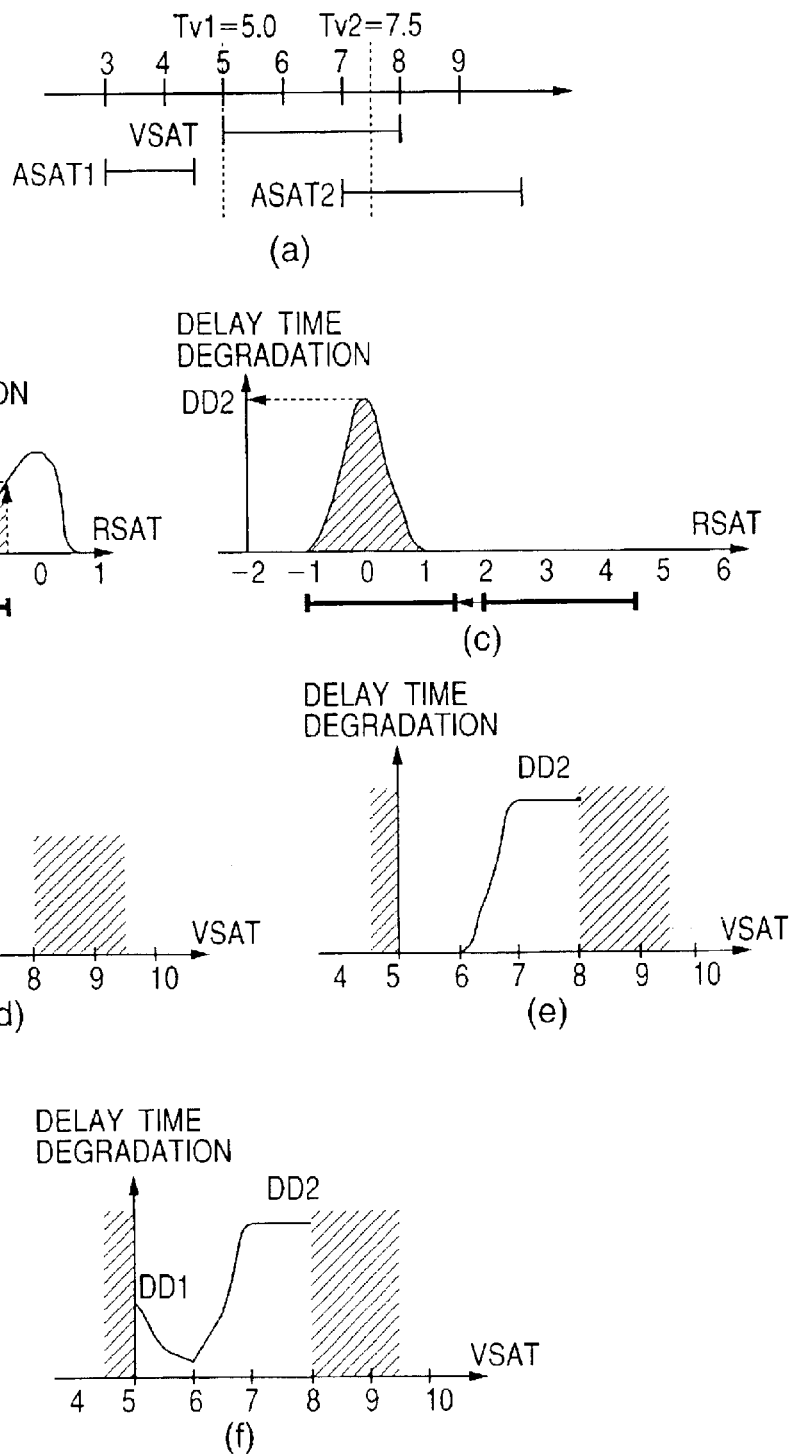
FIGS. 7(a) through 7(f) are diagrams for explaining a crosstalk analysis method according to the invention.

FIG. 7(*a*), like FIG. 5, shows signal arrival times that can occur between a victim wire and two aggressor wires on a time axis and their range (hereinafter referred to as VSAT, ASAT1 and ASAT2, respectively).

FIGS. 7(*b*) and (*c*) are graphs of delay degradation characteristics between the respective aggressor wires and the victim wire, with the horizontal axis representing the relative signal arrival time RSAT and the vertical axis representing the delay degradation value; the ranges that the relative signal arrival times RSAT can take (RSAT windows) where delay degradation occurs when the VSAT between the victim wire and the respective two aggressor wires are at their minimums (i.e., Tv1=5.0 ns in FIG. 7(*a*)) are indicated by bold lines at the bottom of the graphs.

Further, it is indicated by arrows at the bottom of the graphs how the RSAT windows will shift as the VSAT is increased. Thus, the bold lines in the left parts of FIGS. 7(*b*) and 7(*c*) show the ranges the respective RSAT values can take (RSAT windows) when the VSAT values are at their maximums (i.e. Tv2=7.5 ns in FIG. 7(*a*)).

Here, to facilitate understanding, the ranges that the RSAT can take at the minimum and the maximum of the VSAT have been discussed, but, as abbreviations with arrows in the graphs indicate, the whole VSAT ranges were swept, and the RSAT range (RSAT window) is calculated for every actual time of the VSAT (i.e., for every time of signal arrival at the victim wire, Victim).

In FIGS. 7(*d*) and 7(*e*), the worst delay degradation value in the RSAT window at every one of the VSAT times stated above is plotted on the vertical axis, with the horizontal axis representing the absolute time of VSAT (i.e., the signal arrival time that can be taken on the victim wire). The delay degrading characteristic of each of the aggressor wires (Aggressors 1 and 2) on the victim wire (Victim) is shown in terms of the actual time of the VSAT.

FIG. 7(*f*) is a graph regarding all the aggressor wires (regarding Aggressor 1 and Aggressor 2 here) in which their delay degradation characteristics are superposed and added with reference to the absolute time of the VSAT (i.e., the signal arrival time that can be taken on the victim wire).

By figuring out the worst delay degradation value (DD2 in this case) in the VSAT window (5 to 8 ns in actual time) by using the graph (*f*) thereby obtained, the delay degradation value (DDtota12) can be obtained.

Here, it is made possible to figure out a degradation value for the only possible VSAT without adding the worst degradations at the two VSAT times, which can never happen at the same time as stated earlier.

The delay degradation value calculated by the method of the present invention (DDtota12) thus takes on a smaller value than the delay degradation value obtained by the prior art (DDtotal=DD1+DD2), resulting in enhanced accuracy.

Figure 20:
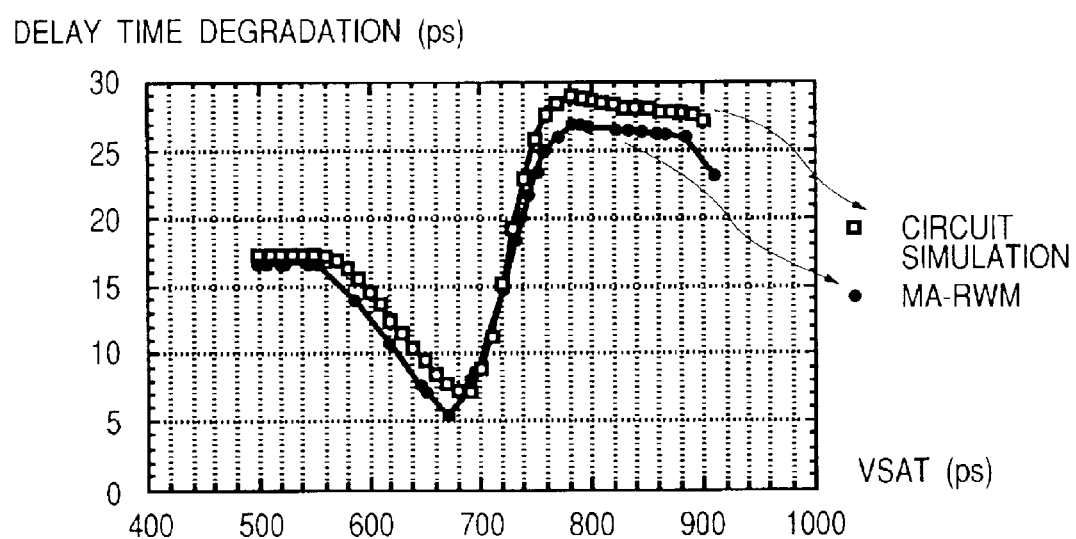
FIG. 20 is a characteristic diagram illustrating comparison with the result of simulation of an actual circuit for explaining the advantages of the invention.

Now, with a view to confirming the effectiveness of this technique, delay degradations in an actual electronic circuit having crosstalk from the aforementioned two Aggressors will be explained in comparison with the results of measurement by simulation at the circuit level. The result of comparison is shown in FIG. 20. As is seen from FIG. 20, the delay degradation value graph figured out using the MA-RWM according to the present invention very well agrees with the result of simulation of an actual circuit.

Further, since the delay degradation value is obtained for every signal arrival time of VSAT, the case in which the delay degradation value is at its maximum is not necessarily the worst case when viewed as a signal to be conveyed to the block or cell of the next stage. It is also seen that the worst case when viewed as a signal to be conveyed to the next stage is the case in which the sum of the signal arrival time of the victim wire (VSAT) and the delay degradation value reaches its maximum.

Now will be described a method for efficiently processing on a computer the analysis of delay degradation values due to crosstalk using the above-described technique according to the invention.

Figure 1:
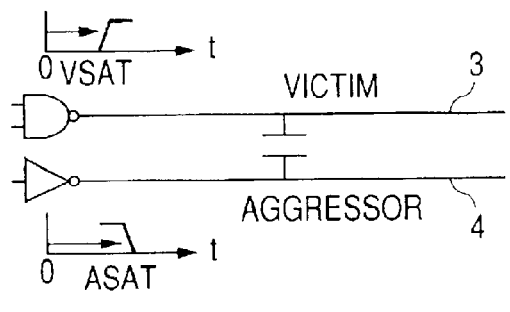
FIG. 1 is a characteristic diagram illustrating delay degradations that vary with the combination of signal arrival times (VSAT and ASAT) on two wires including one victim wire and one aggressor wire.
Figure 2:
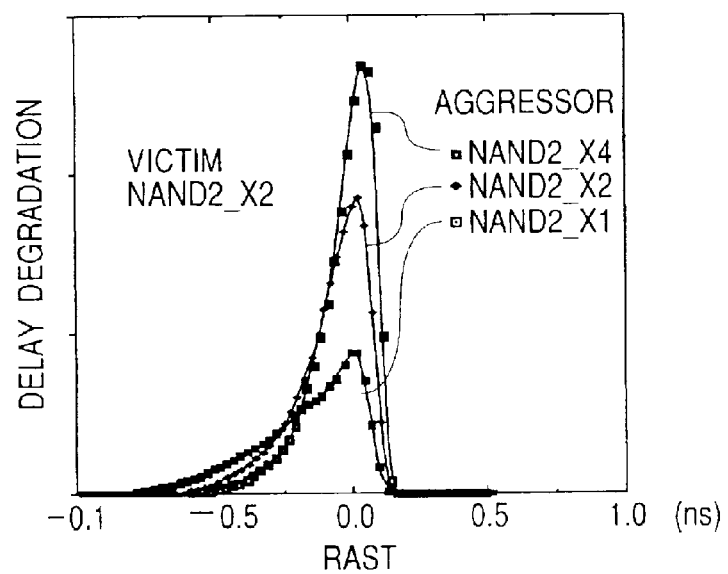
FIG. 2 is a characteristic diagram illustrating delay degradations dependent on the relative signal arrival time (RSAT)

A delay degradation graph or table shows the matching of the relative signal arrival time RSAT with the delay degradation value expressed in strings of dots as exemplified by FIG. 2. In order to create graph information of FIGS. 7(d), 7(e) and 7(f) using this graph or table, as many calculations as the strings of dots are needed, taking a very long time. Therefore, delay time analysis using the invention with crosstalk taken into consideration might take an enormous length of time depending on the scale of circuitry to be taken up.

A method that can solve this problem is shown in FIGS. 8(a) through 8(f). FIG. 8(a), like FIG. 7(a), shows the window relationship between the VSAT and the ASAT1 and ASAT2. FIGS. 8(b) and 8(c), like FIGS. 7(b) and 7(c), simulate a delay degradation table with a number of straight lines instead of expressing it in strings of dots. The figures include a number of characteristic points to determine the straight lines.

In FIGS. 8(d), 8(e) and 8(f), as in FIGS. 7(d), 7(e) and 7(f), the worst delay degradation values in the ASAT window with reference to the VSAT times stated above together with their sum are plotted on the vertical axis, with the horizontal axis representing the absolute time of VSAT (i.e., the signal arrival time that can be taken on the victim wire), and the values are figured out only at the characteristic points where the straight lines are determined as in FIGS. 8(b) and 8(c) and the points are linked by straight lines.

In this manner, there is no need to add many strings of dots to figure out delay degradation values, enabling the computer or the like to compute at higher speed. Moreover, in searching for worst value acquisition within the VSAT range, since the sum of values represented by a straight line can reach its maximum only at a characteristic point thereon, nothing but characteristic points needs to be searched, making possible search processing at higher speed.

Figure 9:
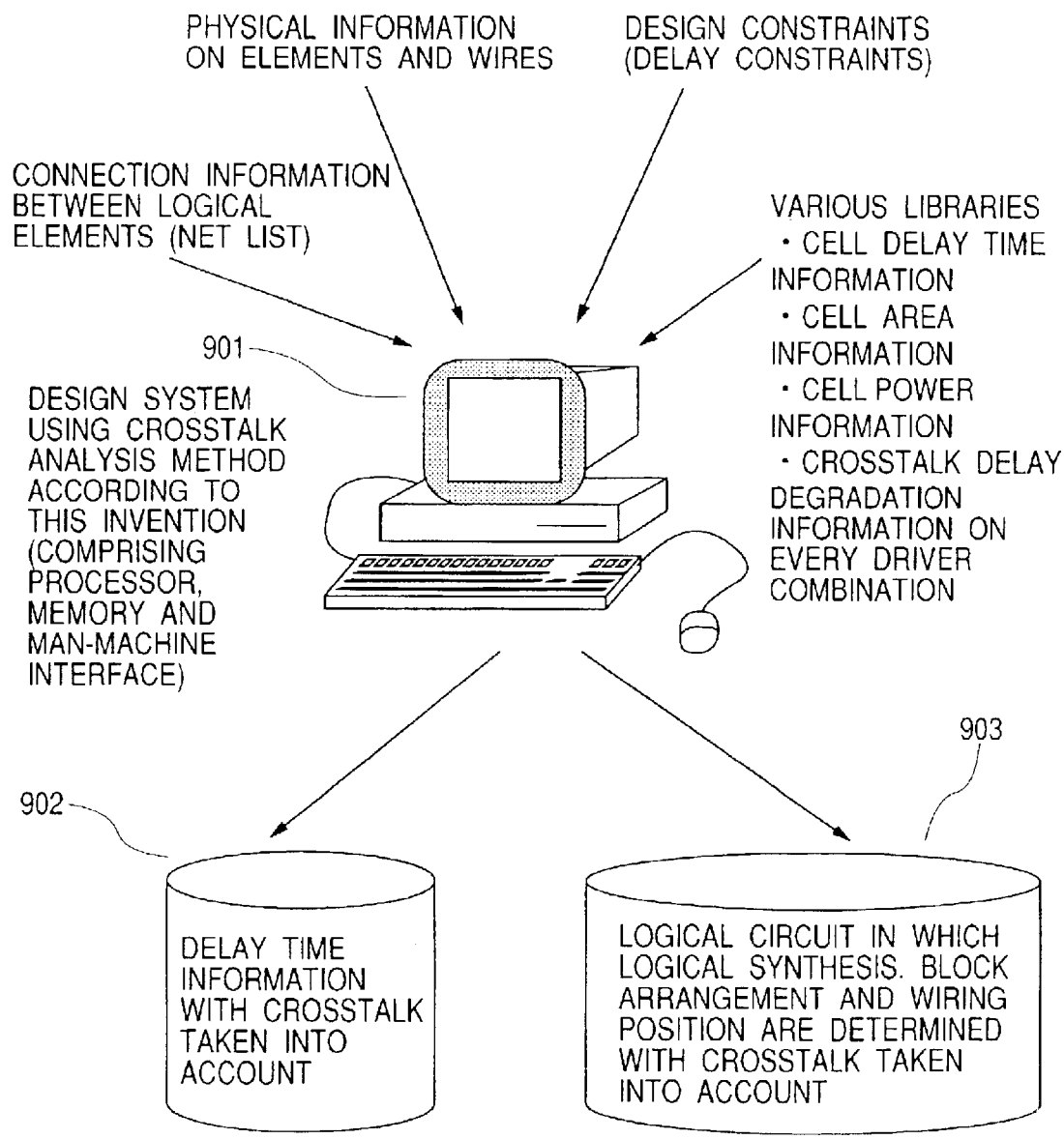
FIG. 9 is a diagram for explaining a semiconductor IC or substrate circuit designing system using the delay degradation analysis technique according to the invention.

Furthermore, the present invention not only makes possible, as illustrated in FIG. 9, calculation of delay degradation values and delay times themselves as shown in 902 on the above-mentioned way using an automatic designing apparatus 901 comprising a processing unit, a memory unit and a man-machine interface, but also, as shown in 903, can provide circuits and systems superior in performance to conventional ones by utilizing the information thereby obtained to alter the logic circuit configuration or the arrangement and wiring positions.

Other objects and novel features of the invention will become more apparent from the embodiments thereof to be described below. Various embodiments of the invention will be described in the following paragraphs with reference to accompanying drawings.

Embodiment 1

This embodiment will be described with reference to FIGS. 10(a) through 10(d) and FIGS. 11(a) through 11(f).

Figure 10:
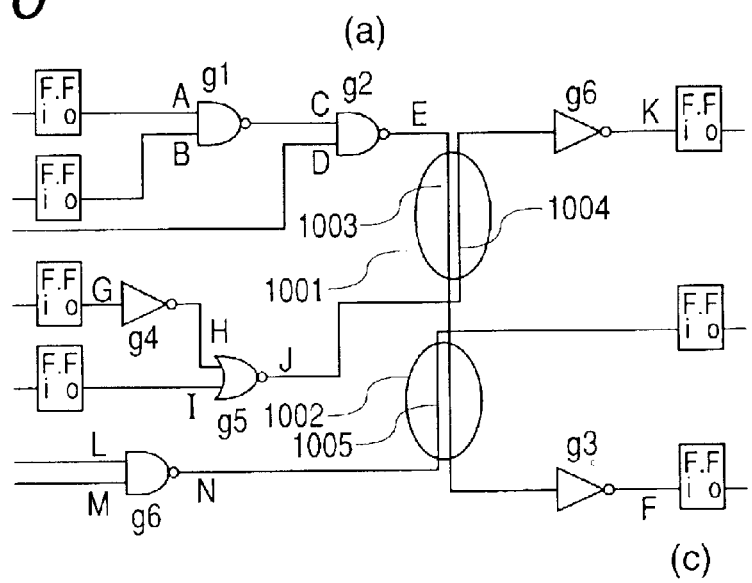
FIGS. 10(a) through 10(d) are diagrams for describing an embodiment of the invention.
Figure 11:
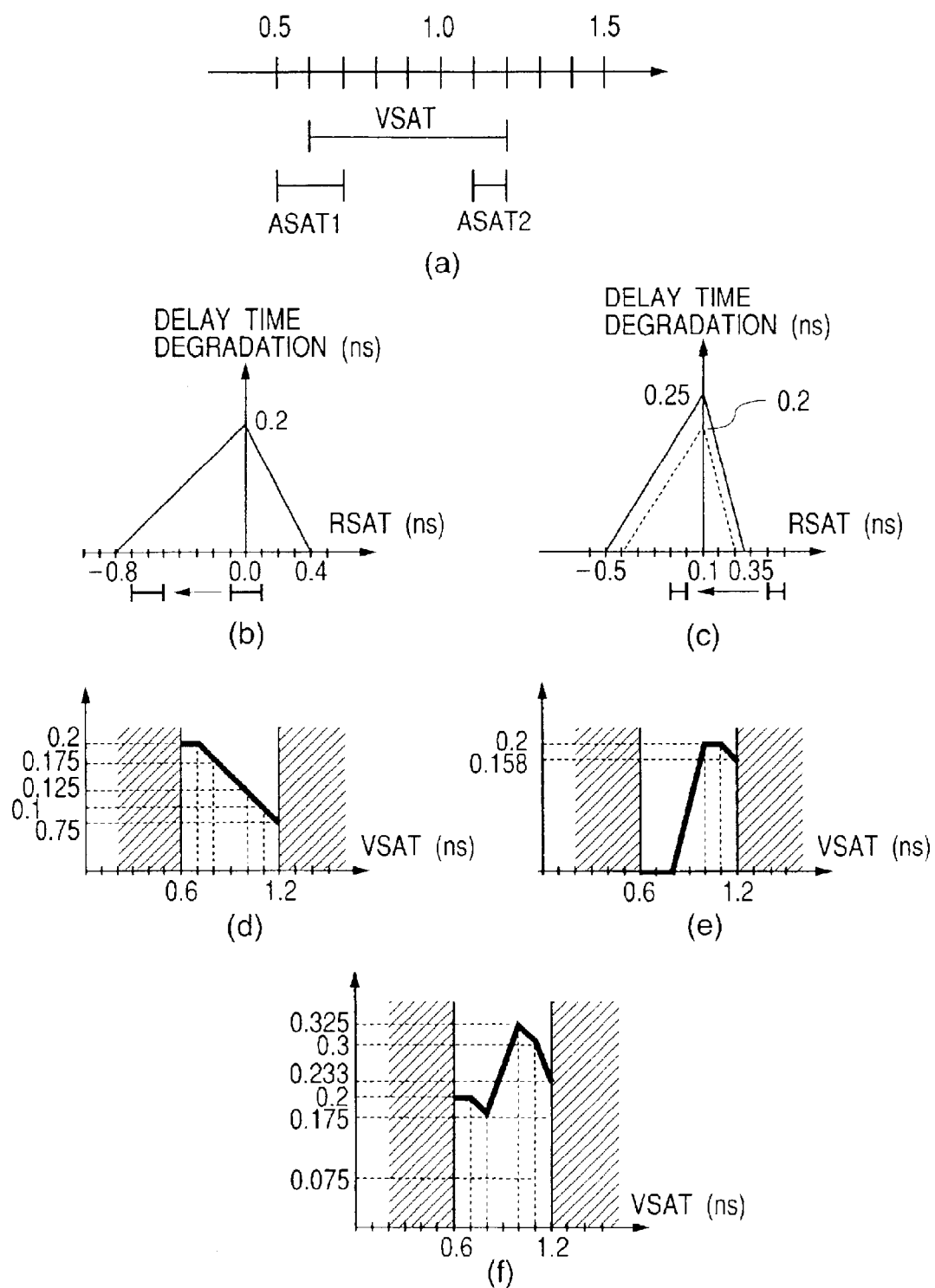
FIGS. 11(a) through 11(f) are for describing the embodiment of the invention together with FIGS. 10.

FIG. 10(a) illustrates how logic circuits are physically connected by wires. Herein, a wire serving the output of a gate circuit g2 (corresponding to a node E) is adjacent to two wires (corresponding to node J and node N) serving the outputs of two other gate circuits (g5 and g6), resulting in crosstalk (1001 and 1002) from a plurality of (two in this diagram) aggressor wires (Aggressors) 1004 and 1005 to a single victim wire (Victim) 1003.

The adjacency length of the victim wire and the aggressor wires here is given as shown in FIG. 10(b). The constraints of the overall system design are supposed to include setting of the signal delay time from node A to node F to 1.7 ns. Also the signal delay times between the input and the output of individual gate circuits are supposed to be given as listed in FIG. 10(c).

First, supposing the absence of crosstalk, calculation of the signal arrival time at each node in FIG. 10(a) will give the values listed in FIG. 10(d).

Here to look at, for instance, the signal arrival time at the node E which is on the victim wire, the minimum signal arrival time is 0.6 ns and the maximum signal arrival time is 1.2 ns. The reason why the signal arrival time cannot be determined uniquely in this way was already explained. Similarly, for the node J and the node N on aggressor wires as well, the signal arrival time cannot be uniquely determined, but has a window of a range (or time width) between the minimum signal arrival time and the maximum signal arrival time.

Next will be described a step of calculating crosstalk-deriving delay degradations by using this signal arrival time information with reference to FIGS. 11(a) through 11(f).

First, FIG. 11(a) shows the windows of signal arrival time of the victim wire (node E) (VSAT) and of signal arrival time of the two aggressor wires (node J and node N) (ASAT1 and ASAT2) on the basis of the information tabulated in FIG. 10(d) Further as shown in FIG. 11(b), a graph or table showing the relationship between the relative signal arrival time RSAT and the delay degradation value for a pair of two-input NAND circuit and two-input NOR circuit to drive the victim wire and the aggressor wires when the typical (representative) adjacency length is supposed to be 500 μm is given as a library. It is preferable that circuit data be made ready with the adjacency length as the parameter. It is also preferable, as will be described afterwards with respect to another embodiment of the invention, that a plurality of different adjacency lengths are set and data including the RSAT and the delay degradation values then are given in advance as an electronic circuit library by experiment or circuit simulation.

FIG. 11(c) illustrates a similar library for a pair of two-input NAND circuit and two-input OR circuit to drive the victim wire and the aggressor wires. Since the actual adjacency length of wires in the circuit of FIG. 10(a) is 400 μm, the graph of delay degradation values registered in the library prepared to match the condition of 500 μm in adjacency length is compressed to match the condition of 400 μm, and the compressed values are represented by dotted lines in FIG. 11(c) Further at the bottom of the graphs of FIGS. 11(b) and 11(c), how the relative signal arrival time windows at the minimum VSART shift to the windows at the maximum VSAT is represented by arrows.

The maximum delay degradation value in the window range of each individual VSAT among the ranges the VSAT can take is shown in FIGS. 11(d) and 11(e). FIGS. 11(d) and 11(e) illustrate the characteristics of the delay degradation to which signals on the victim wire are subjected by signals arriving on the aggressor wires 1 and 2, respectively.

FIG. 11(f) shows the sum of delay degradation values at the same VSAT, i.e. the actual time of the VSAT, with this plurality of characteristics shown in FIG. (d) and (e) being superposed with reference to the absolute time or actual time of the VSAT (i.e., the signal arrival time on the victim wire).

It is seen from the characteristic diagram of FIG. (f) that the largest among the delay degradation values thereby obtained is 0.325 ns when VSAT=1.0 ns.

As a result it is seen that, while the delay time at node F in the supposed absence of crosstalk is 1.5 ns, the delay time at point F here with crosstalk taken into account, because the maximum delay degradation obtained by the above-explained calculation is 0.325 ns, is 1.5 ns+0.325 ns=1.825 ns, which fails to satisfy the design constraint of 1.7 ns.

If analysis in further detail is possible, since the delay degradation value at each VSAT is known according to the invention as shown in FIG. 11(f), the following can also be known by utilizing it.

Thus, as the VSAT at node E in the foregoing case is 1.0 ns, this increases by 0.325 ns to 1.325 ns, and the delay time at node F is augmented by 0.3 ns to 1.625 ns. On the other hand, because the delay degradation value is 0.3 ns when VSAT =1.1 ns as FIG. 11(f) shows, the VSAT at node E increases by 0.3 ns to 1.4 ns, and the delay time at node F is augmented by 0.3 ns to 1.7 ns. Also, since the delay degradation value is 0.233 ns when VSAT=1.2 ns as FIG. 11(f) shows, the VSAT at node E increases by 0.233 ns to 1.433 ns, and the delay time at node F is augmented by 0.3 ns to 1.733 ns.

These values reveal that the biggest crosstalk-deriving constraint violation at node F is 1.733 ns–1.7 ns=0.033 ns when VSAT=1.2 ns.

Therefore, as described above, a designer using the present invention can know, if there is any crosstalk, before working out actual semiconductor circuits or circuits mounted on a substrate that the circuits designed do not properly complete their operations before the designed time constraint, together with quantitative information on the violation of the constraint, and accordingly can save the time and cost which would otherwise be taken to design and produce an actual LSI and the time and cost of redoing the design.

Embodiment 2

An example of correcting wiring after the delay time calculation in Embodiment 1 described above will be explained with reference to FIGS. 12(a) and 12(b) and FIGS. 13(a) through 13(f).

Figure 12:
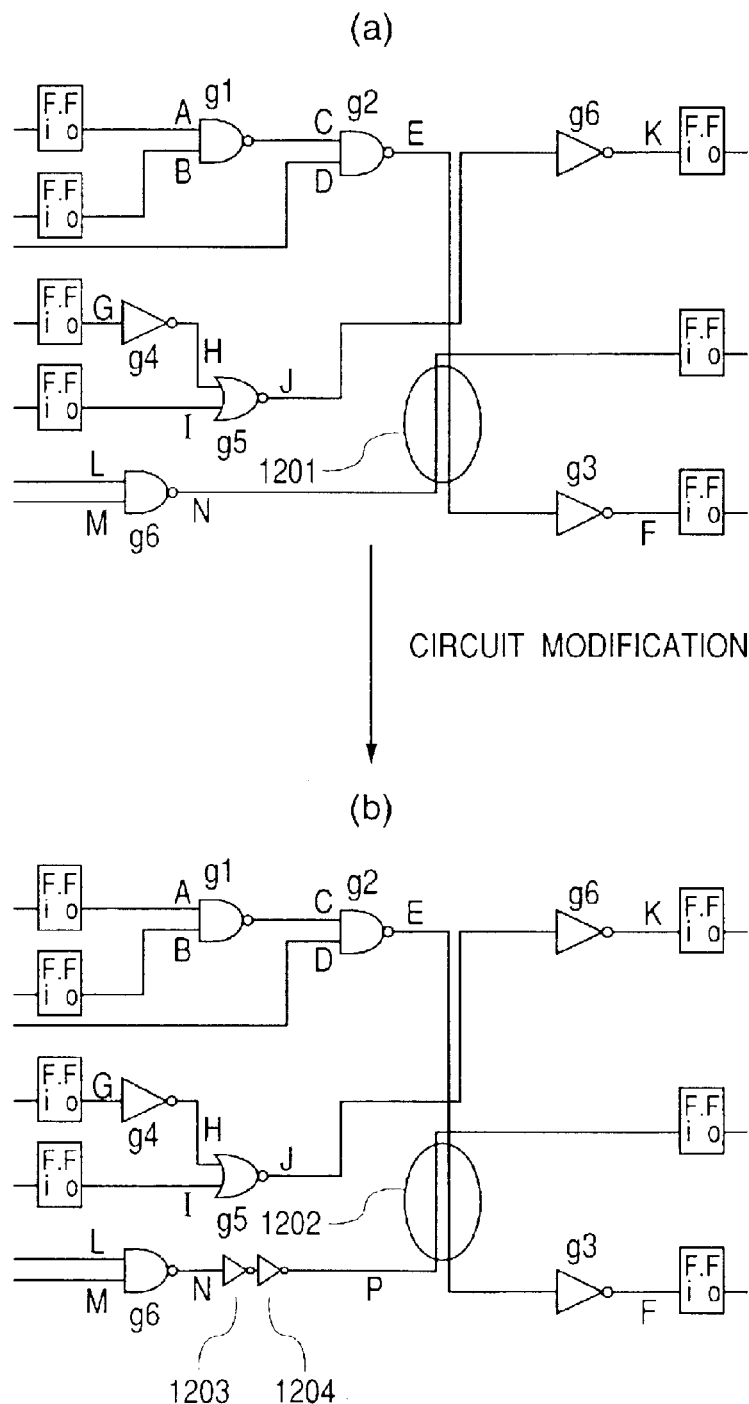
FIGS. 12 (a) and 12 (b) are for describing another embodiment of the invention.

The circuit of FIG. 12(a) is the same as the circuit shown in FIG. 10(a). First, as described with reference to Embodiment 1 above, by analyzing crosstalk-deriving delay degradation values, it can be known that this circuit does not satisfy the constrain condition.

Hereupon, in order to correct this violation of the constraint condition, note is taken of crosstalk 1201 from a second aggressor wire, and the circuit is modified or correct by inserting gate circuits 1203 and 1204 for delaying the signal arrival time into the aggressor wire part as shown in FIG. 12(b) How this modification or correction eliminates the violation of the constraint condition will be explained with reference to FIGS. 13(a) through 13(f).

Figure 13:
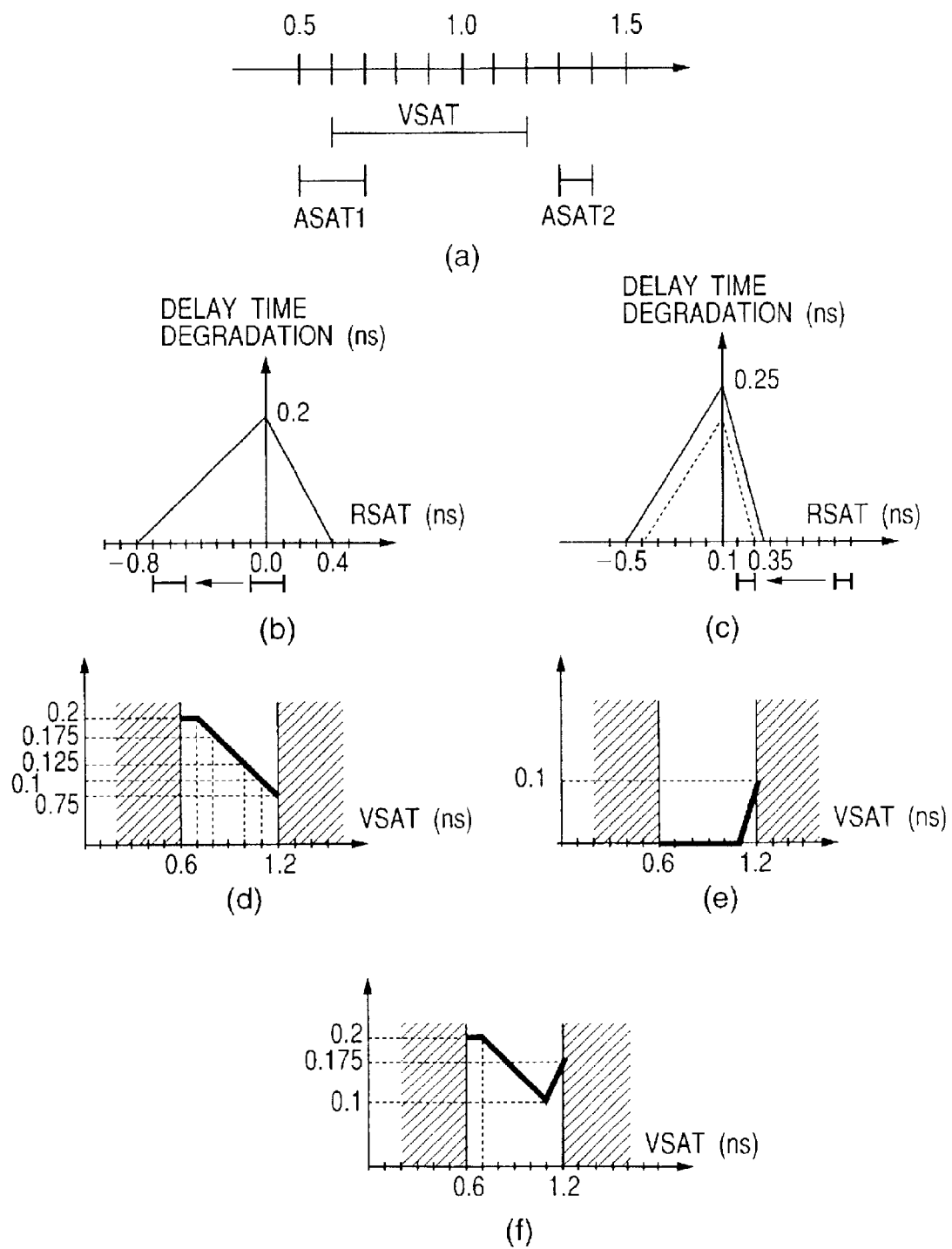
FIGS. 13 (a) through 13 (f) are for describing still another embodiment of the invention.

FIG. 13(a) shows how the signal arrival time at the second aggressor wire node P is varied by the circuit modification mentioned above. Along with that, the RSAT window movement shown at the bottom of FIG. 13(c) and the delay degradation value characteristic diagram for each VSAT shown in FIG. 13(e) vary.

Superposing the delay degradation values due to crosstalk attributable to the two aggressor wires on the basis of the signal arrival time on the victim wire gives FIG. 13(f) It is seen that the maximum delay degradation value here is 0.2 ns, and this means that the delay time at point F with crosstalk taking into account is 1.5 ns+0.2 ns=1.7 ns, satisfying the initial constraint condition of the design.

It is further seen that, if analysis in more detail is required, the VSAT at node E when the maximum delay degradation value is as stated above is 1.0 ns, which increases by 0.2 ns to 1.2 ns, and the delay time at node F is augmented by 0.3 ns to 1.525 ns, satisfying the constraint condition of 1.7 ns.

When VSAT=1.2 ns, since the delay degradation value is 0.175 ns as FIG. 13(f) shows, the VSAT at node E increases by 0.175 ns to 1.375 ns, and the delay time at node F is augmented by 0.3 ns to 1.675 ns. These figures indicate that the constraint condition of 1.7 ns is satisfied at node F affected by crosstalk.

Thus after calculating the delay time by the analysis technique according to the invention, solution of the problem by shifting on the time axis the signal arrival time on the aggressor wires giving rise to constraint violation is greatly facilitated.

Various methods are available for use in shifting the signal arrival time on the time axis. For instance, delay gates may be inserted as in the example described above, or delay elements combining resistors and capacitors can as well be used. It is also possible to delay the signal arrival time by shifting the positions of gates which serve as drive circuits and intentionally arranging them far from the crosstalk generating part. Another available alternative is to insert a delay element on the signal propagation path of the victim wire.

It can be readily understood from the foregoing description according to the graphs showing the respective VSAT-versus-delay degradation value characteristics that the delay degradation quantity can be reduced by, for instance, modifying or correcting the circuit shown in FIG. 14(a) into what is shown in FIG. 14(b) or 14(c).

Embodiment 3

It is further possible to realize a semiconductor integrated circuit, circuits inside a package or a printed circuit board having superior characteristics by using the crosstalk analysis method according to the present invention to analyze delay degradation invited by crosstalk from a plurality of aggressor wires. One such example will be described with reference to FIG. 15.

Figure 15:
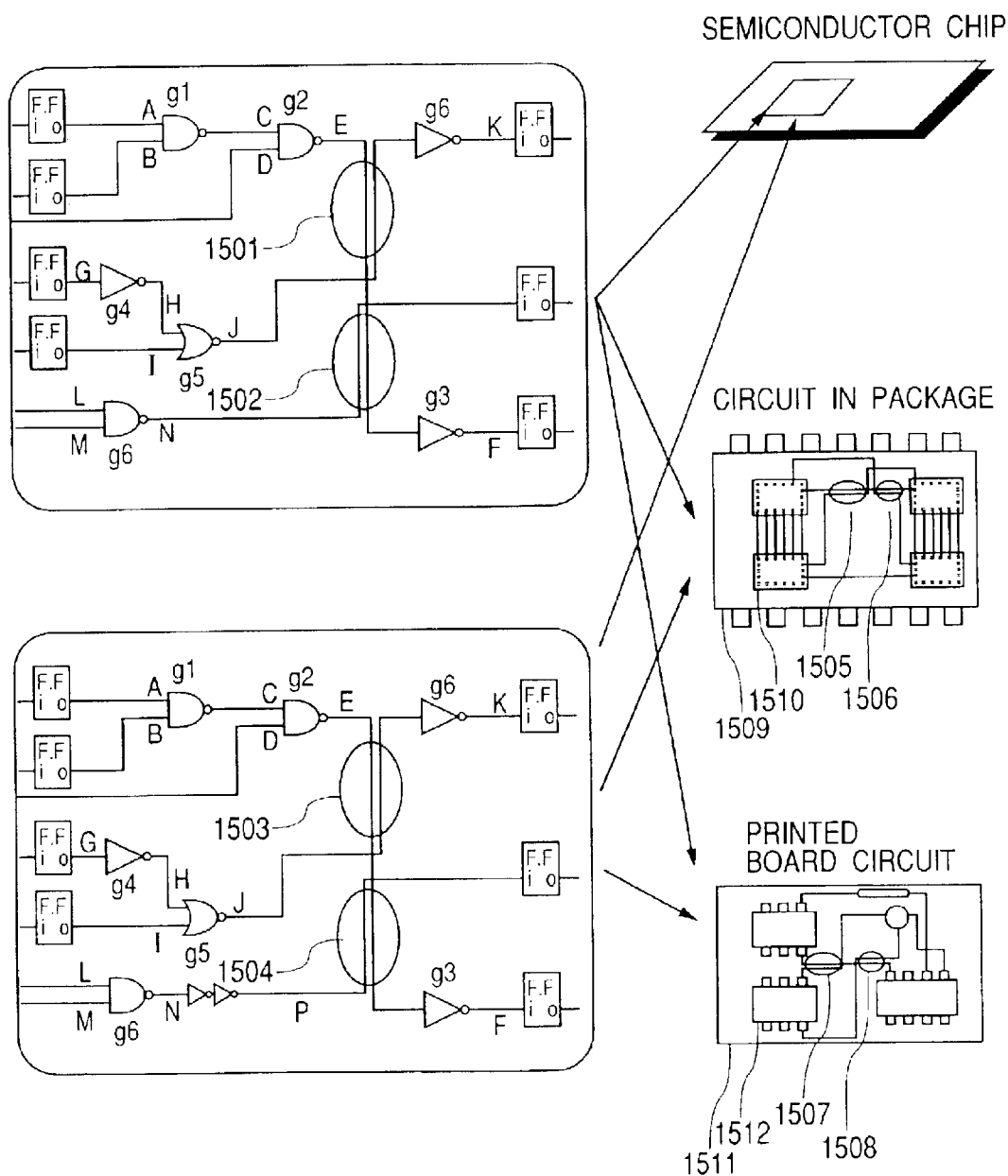
FIG. 15 is for describing still another embodiment of the invention.

As denoted by 1505 and 1506 in FIG. 15, crosstalk may arise on wires between logical cells or wires between blocks in the case of a semiconductor integrated circuit or, in circuits inside a package, crosstalk may arise, when connecting a plurality of chips inside the package, on the connecting wires. And as denoted by 1507 and 1508 in FIG. 15, similar crosstalk may arise in circuits on a printed circuit board as well, on wires between semiconductor packages or on wires between individual elements such a case, according to the invention, it is possible to workout a semiconductor integrated circuit, circuits inside a package or a printed circuit board whose delay time data taking account of crosstalk are stated as specification data in data books and elsewhere. It is also possible to reduce, by using the above-described technique, the influence of different kinds of crosstalk and work out a semiconductor integrated circuit, circuits inside a package or a printed circuit board improved in this respect as representatively shown by the circuit diagram in the lower left part of FIG. 15.

Embodiment 4

Further will be described a case in which substep (d-1) described in the section of the mode for carrying out the invention, i.e. substep 6041 in FIG. 6, is executed in advance by experiment or circuit simulation, and the result is recorded and stored in a computer-readable way into a recording medium, such as an optical disk or a magnetic disk, as an electronic circuit library regarding signal delay characteristics. The data form for such recording medium is shown in FIGS. 16(a) and 16(b).

FIG. 16(a) illustrates an example of data information (library) of relative signal arrival time and delay degradation value in a combination in which the drive circuit for the victim wire (Victim) has a 2 level of drivability (load drivability) of a NAND2 gate and that for the aggressor wires (Aggressors) has a 1 level of drivability (load drivability) of a NAND2 gate.

Similarly, FIG. 16(b) illustrates an example of data information (library) of relative signal arrival time and delay degradation value in a combination in which the drive circuit for the victim wire (Victim) has a 1 level of drivability of a NAND2 gate and that for the aggressor wires (Aggressors) has a 2 level of drivability of an INV2 inverter.

Thus it is preferable that conditions regarding various combinations with load drivability levels of drive circuits (drivers) at the output stage, constituting circuit blocks and cells (hereinafter referred to as circuit units) to whose output units wires are connected, be annexed to the library for each circuit unit.

As already stated, the condition for acquiring a library need not be only one, but it is rather preferable that a library be acquired in respect of a plurality of conditions.

FIGS. 16(a) and 16(b) show, as examples used in an embodiment of the invention, libraries acquired for a plurality of adjacency lengths in respect of a condition of 500 μm in adjacency length and a condition of 1,000 μm. If the adjacency lengths actually encountered are, for instance, between 500 μm and 1,000 μm, it is possible to figure out the delay degradation value by interpolating between the data of the two libraries. This makes it possible, in an actual case in which a library is acquired under the sole condition that the adjacency length is 500 μm for instance and the actual adjacency length widely differs from 500 μm, to avert the problem that the delay degradation value cannot be accurately calculated.

As a condition to be met in preparing a library such as those shown in FIG. 16, it is also possible to acquire a library by varying the wire length on the side closer to the drive circuit than the wire part where crosstalk occurs (wire length from the driver to the start point of the adjacency) or the wire length on the side farther from the drive circuit (receiver side) (wire length from the end point of the adjacency to the receiver) on the victim wire (Victim) and the plurality of aggressor wires (Aggressors) such as those shown in reference to the present invention. FIG. 17(a) shows an example in which a library is acquired where there is neither a wire length from the driver to the start point of the adjacency nor a wire length from the end point of the adjacency to the receiver. By contrast, FIG. 17(b) shows a case in which a library is acquired where a wire length from the driver to the start point of the adjacency is set to a certain length. Similarly, FIG. 17(c) shows a case in which a library is acquired where a wire length from the end point of the adjacency to the receiver is set to a certain length.

Where there is a wire length from the driver to the start point of the adjacency or a wire length from the end point of the adjacency to the receiver as in these cases, the delay degradation value tends to be greater than in their absence. FIG. 17(d) illustrates an example of such delay degradation value.

It is supposed now that delay degradation values in a case where there is neither a wire length from the driver to the start point of the adjacency nor a wire length from the end point of the adjacency to the receiver as shown in FIG. 17(a) are given as a curve 1701 in FIG. 17(d). If there is a wire from the driver to the start point of the adjacency as shown in FIG. 17(b) or a wire from the end point of the adjacency to the receiver as in FIG. 17(c), delay degradation values usually increase (or decrease) in the quantity or range of degradation as represented by a curve 1702 in FIG. 17(d).

Therefore, if for instance a library is acquired by varying the wire length from the driver to the start point of the adjacency and the wire length from the end point of the adjacency to the receiver in a plurality of ways, it is possible to generate a curve 1703 of delay degradation information so as to interpolate between the curves 1701 and 1702 when it becomes necessary to analyze various case differing in wire length from the driver to the start point of the adjacency and in wire length from the end point of the adjacency to the receiver.

Further, it goes without saying that greater effectiveness can be achieved if a library combining various conditions as described above and covering a greater number of combinations can be made ready in advance.

Embodiment 5

Further by using a designing system utilizing the crosstalk analysis technique according to the present invention, it will be easier for the designer to perform delay time calculation with the influence of crosstalk taken into account or to work out a circuit configuration or a system configuration capable of averting or reducing crosstalk. An example of this point will be described with reference to FIG. 18.

Figure 18:
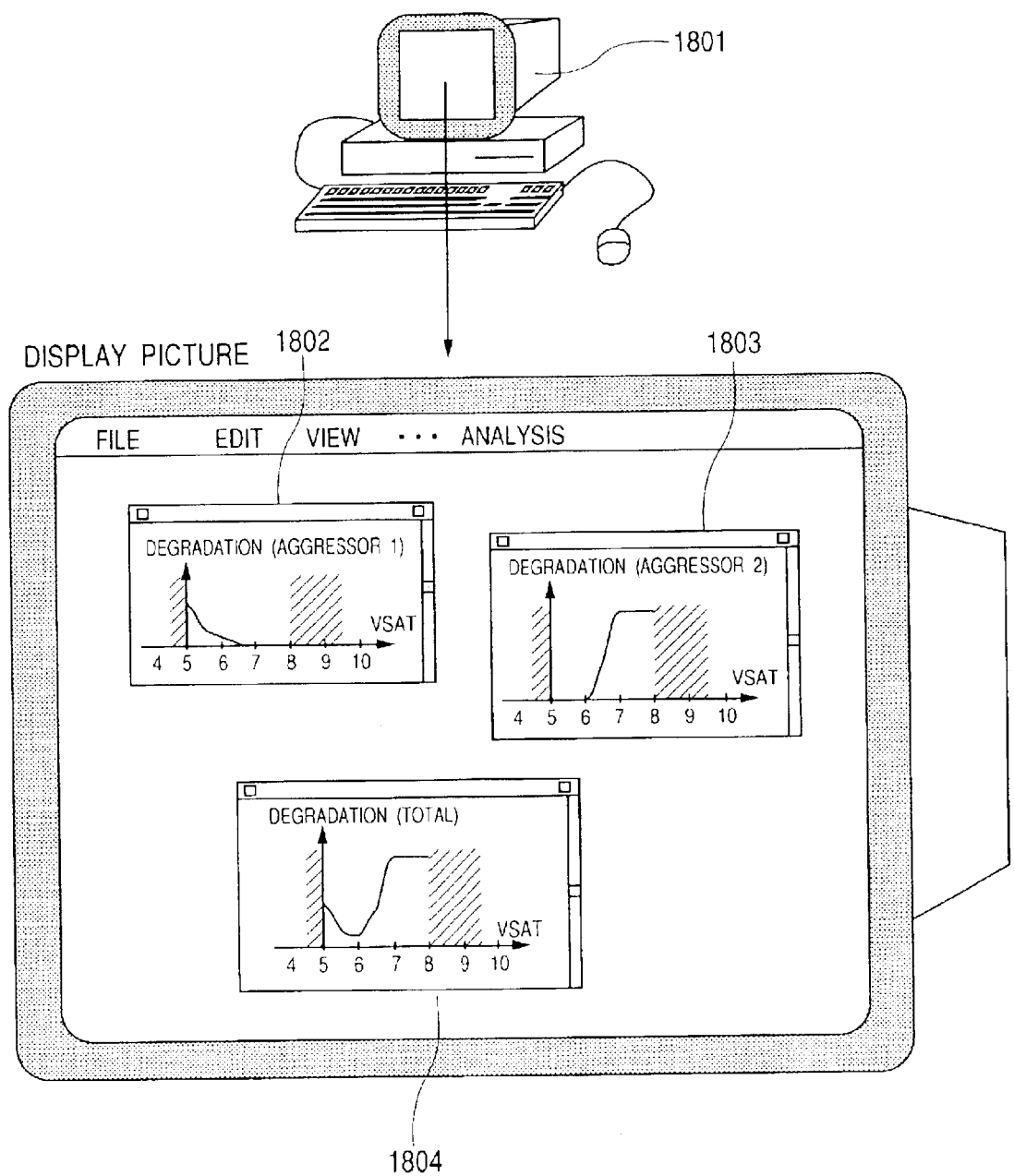
FIG. 18 is for describing a designing system according to the invention and a display screen for use therein.

For instance, as shown in FIG. 18, in the presence of a plurality of Aggressors and crosstalk from each of them to a victim wire, a designing system 1801 coupled to a computer referred to in 901 of FIG. 9 displays on its single screen, in performing delay time calculation, separately characteristic diagrams of delay degradations due to crosstalk from the respective aggressor wires as shown in 1802 and 1803 and also displays a characteristic diagram representing the total of the influences from the respective aggressor wires as shown in 1804. This manner of displaying is highly effective. Thus, a plurality of characteristic diagrams of delay degradation values based on the actual time of VSAT (i.e., the signal arrival time on the victim wire) explained with reference to FIG. 7, FIG. 8, FIG. 11 or FIGS. 13(d) through 13(f) are displayed on a single screen.

This plurality of characteristic diagrams may as well be displayed on different screens if necessary, but the designer would find them more convenient in this collective displaying on the same screen.

In this way, the designer can simply know the magnitude of the influence of respective aggressor wires on the victim wire in a state including dynamic variations of the signal arrival time, and this feature enables him or her not only to locate more easily the position to be worked upon but also, where each of the positions of crosstalk is worked upon (for instance where a method shown in FIGS. 14(a) through 14(c) is used or where the distance between wires in the crosstalk position is enlarged), to immediately check by direct watch the total of the crosstalk-deriving delay degradation values, resulting in quicker effective solution of the problem.

Figure 19:
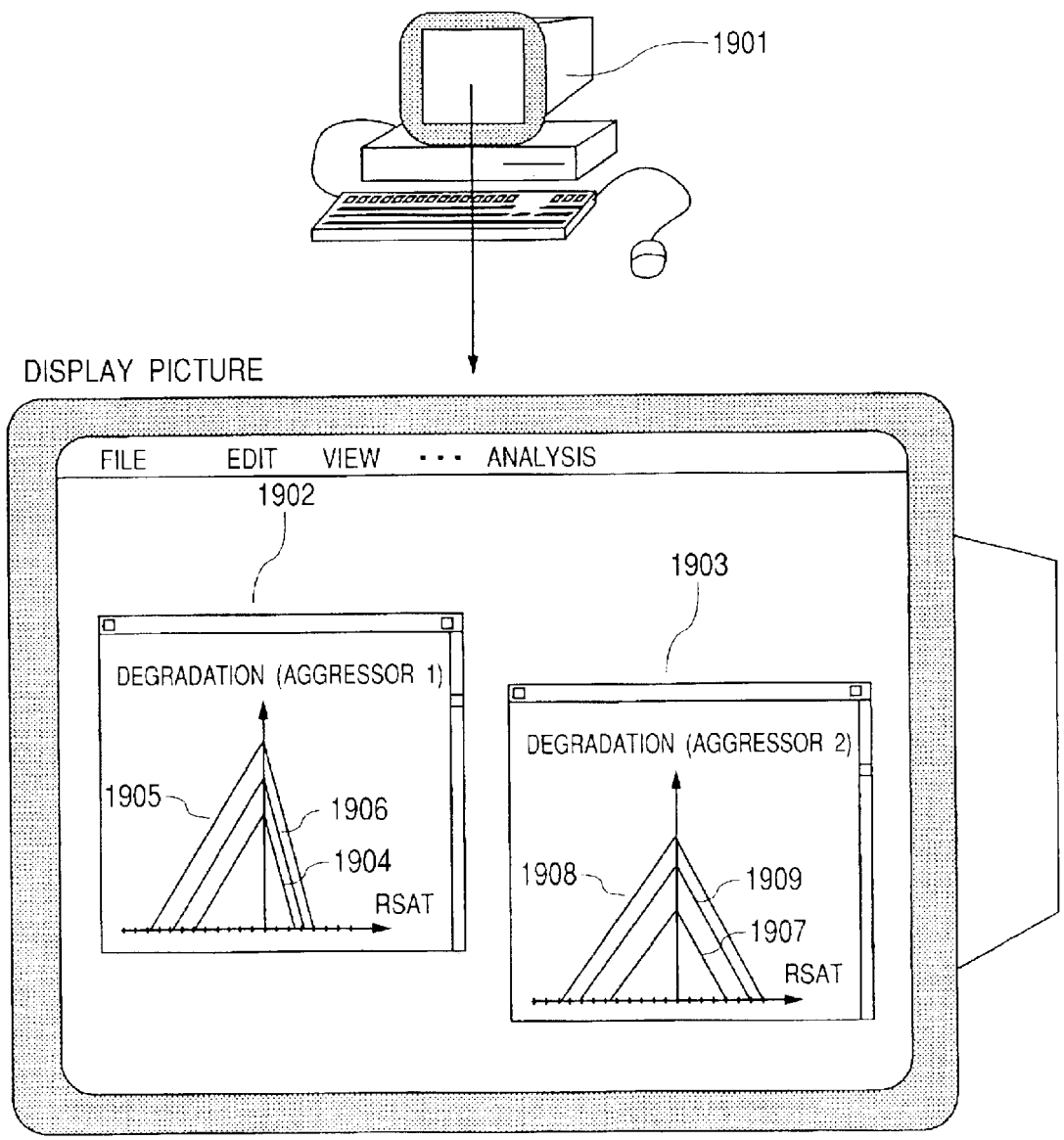
FIG. 19 is for describing another designing system according to the invention and a display screen for use therein.

Further, in an alternative example shown in FIG. 19, it is also preferable to make it possible to check on display screens (1901, 1902 and 1903) of the designing system how the influence of crosstalk-deriving delay degradation from each of the aggressor wires (Aggressors) is as a matter of library information (curves 1904 and 1907 in FIG. 19), how it varies affected by the wire length from the driver to the start point of the adjacency (1905 and 1908), and how it varies affected by the wire length from the end point of the adjacency to the receiver (1906 and 1909).

Use of such a designing system enables the designer not only to know the delay degradation value due to crosstalk from each Aggressor as shown in FIG. 18 but also to obtain information on its enlargement by the wire length from the driver to the start point of the adjacency of the wire length from the end point of the adjacency to the receiver, and thereby to address the enlarged degradation appropriately.

Incidentally, such a designing system can be mounted not only in a stand-alone computer but also in a remotely located computer connected by a network, such as the Internet. In the latter case, processing of delay time analysis and crosstalk aversion or reduction according to the invention is executed on the remotely located computer, and inputting to and outputting of calculation results from the remote computer can be accomplished at another computer or a display/input system on the designer's side.

Embodiment 6

Although the crosstalk analysis technique (MA-RWM) and the method for designing/manufacturing electronic circuit devices by using the same according to the present invention has been described with focus on a case in which there are two Aggressors for the sake of the ease of understanding, the invention can prove even more effective when applied to an electronic circuit device having a greater number of Aggressors as described earlier. This point will be explained below with reference to FIG. 21 and FIGS. 22(*a*) through 22(*c*).

Figure 21:
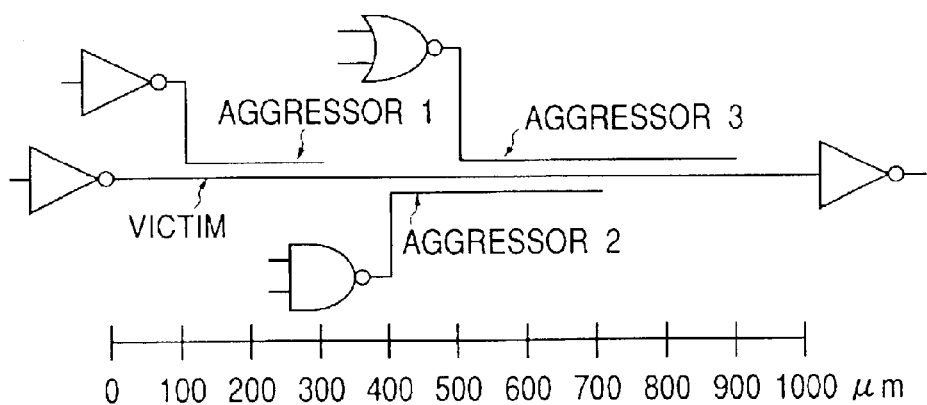
FIG. 21 is a circuit diagram for describing an example of applying the invention to a case in which there are three Aggressors.

FIG. 21 illustrates a specific example of an experiment with an electronic circuit in which three aggressor wires, i.e. (Aggressors 1, 2 and 3) are arranged close to a single victim wire (Victim). AL in the diagram denotes the length of the adjacent wires (adjacency length). Here is depicted a state in which the respective Aggressors inflict crosstalk 1, 2 or 3 on the victim wire. This circuit was used to simulate a circuit in which the relationship between the VSAT window and the ASAT window was in the states of cases 1 and 2 shown in FIGS. 22(*a*) and 22(*b*), respectively.

Figure 22:
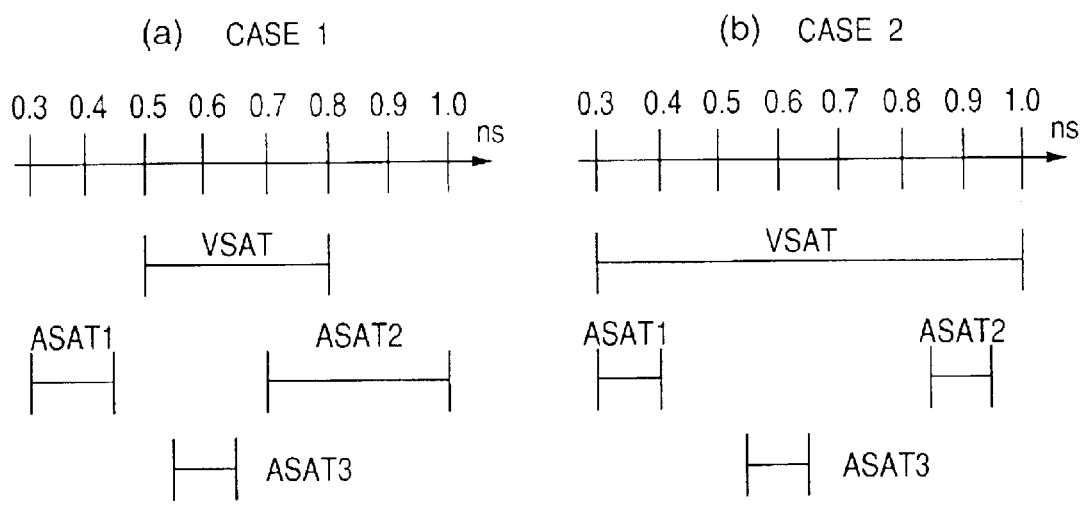
FIGS. 22(a) through 22(c) are diagrams for explaining the advantages of applying the invention to the example of FIG. 21.

FIG. 22(*c*) tabulates calculated delay degradation values obtained for each of these cases by simulation of an actual circuit, by a simple technique using the RWM mentioned above, and by using the MA-RWM according to the invention.

From these results, it is understood that, where the VSAT window is narrow and the plurality of Aggressor windows are close to each other as in case 1 shown in FIG. 22(*a*), delay degradation values are calculated with relative accuracy even by the RWM technique, with an error of only about 4%. However, where the VSAT window is wide and the plurality of Aggressor windows are relatively apart from each as in case 2 shown in FIG. 22(*b*), delay degradation values are calculated with a very large error by this RWM technique.

It is seen on the other hand that, by the MA-RWM technique according to the invention, the error is small in both cases, and delay degradation values well agreeing with the result of circuit simulation can be obtained.

Figure 23:
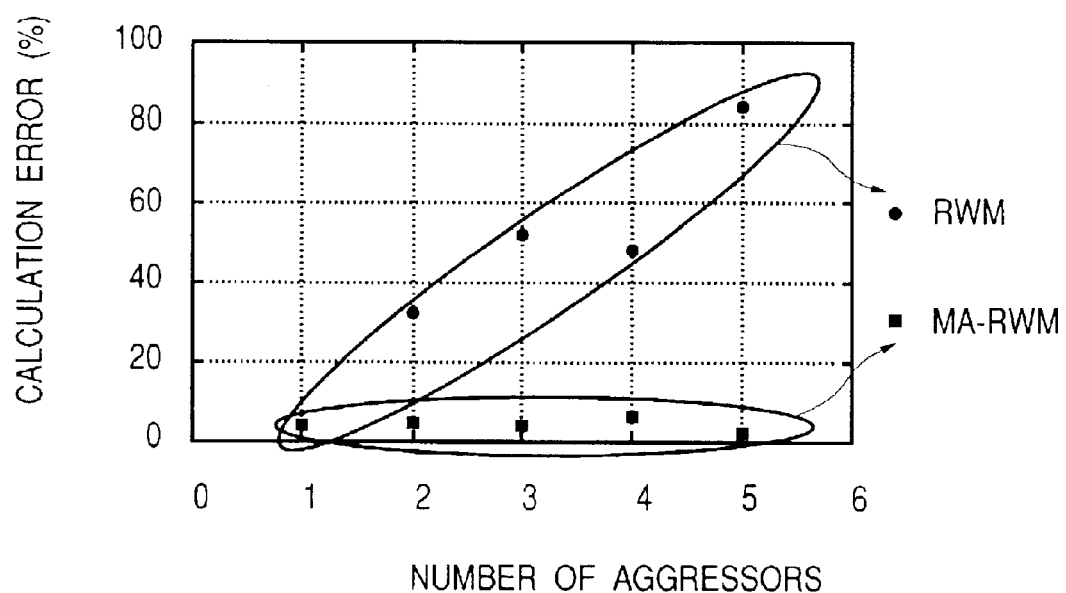
FIG. 23 is a diagram of characteristics actually measured for explaining the advantages of the invention.

Furthermore as a result of various experiments with trial products, it was also found that errors in such delay degradation values obtained, whether by the RWM technique or the MA-RWM technique according to the invention, are also dependent on the number of Aggressors. Thus, as shown in FIG. 23, while errors are insignificant, hardly differing with the method, where there is only one Aggressor, the simple RWM method gives rise to more than 50% errors than the troublesome circuit simulation where the number of Aggressors is two ore more, the MA-RWM method according to the invention permits calculation of delay degradation values with less than 10% errors. This reveals that the greater the number of aggressor wires, for instance the larger the scale of the electronic circuit device, the more significant the effect of applying the invention.

Whereas the present invention has hitherto been described in detail with reference to various embodiments thereof, it can be applied to signal delay time calculation methods which take account of crosstalk between adjoining wires, in semiconductor integrated circuit devices, electronic circuit devices mounted within a package, electronic circuit devices mounted on a substrate and electronic circuit systems, and in particular in general purpose processors, signal processors, image processors, semiconductor memories, system modules, computer systems and portable device systems each having a configuration in which inputs and outputs of logic circuits are connected by wiring, and the designing and manufacturing of electronic circuit devices using such methods.

Industrial Applicability

Use of the present invention makes possible to accurately analyze delay degradations in the presence of a plurality of aggressor wires taking into account such crosstalk as would result in dynamic variations in the signal arrival time on each of the victim wire and the aggressor wires dependent on the input pattern. It is also made possible to realize a system for verifying operations at a fixed frequency with crosstalk taken into consideration. Especially by applying the invention to the so-called critical path in an electronic circuit device, high performance integrated circuits and substrate-mounted systems protected from crosstalk can be realized efficiently.

What is claimed is:

1. A crosstalk analysis method for analyzing signal crosstalk that a plurality of aggressor wires adjoining a victim wire inflict on said victim wire, the method comprising the steps of:

determining delay degradation that each of said plurality of aggressor wires inflicts on said victim wire according to a range that can be taken by the respective dynamic signal arrival times on said victim wire and said plurality of aggressor wires, and adding said delay degradations with reference to the signal arrival time on said victim wire.

2. A crosstalk calculation method of an electronic circuit device for calculating crosstalk that a second and a third aggressor wires inflict on a first wire in the electronic circuit device having said second and said third aggressor wires which are arranged adjacent to said first wire, said first wire being connected to an output section of a first electronic circuit unit, said second and said third aggressor wires being connected to output sections of a second and a third electronic circuit unit respectively, the method comprising the steps of:

calculating a range of signal arrival time of each of said first wire and said second and said third aggressor wires on the basis of delay characteristics of signals in each of said first, said second and said third electronic circuit units, determining delay degradation values due to crosstalk affecting said first wire according to timing of signals arriving on said second and said third wires on the basis of relative signal arrival times obtained by relative measuring of signal arrival times on said second and third wires with reference to a signal arrival time on said first wire, and adding and said delay degradation values with reference to the signal arrival time on said first wire.

3. A crosstalk analysis method for analyzing signal crosstalk that a plurality of aggressor wires adjoining a victim wire inflict on said victim wire, the method comprising the steps of:

calculating a maximum value of delay degradation inflicted on said victim wire within a range of signal arrival time of each of said plurality of aggressor wires with reference to a signal arrival time on said victim wire for each of said aggressor wires, adding results of tic step of calculating with reference to the signal arrival time on said victim wire, and determining total delay degradation inflicted on said victim wire by crosstalk from said plurality of aggressor.

4. An electronic circuit device manufacturing method for manufacturing an electronic circuit device having the plurality of aggressor wires by using a crosstalk analysis method wherein a plurality of aggressor wires adjoining a victim wire inflict on said victim wire, the method comprising the steps of:

determining a delay degradation that each of said plurality of aggressor wires inflicts on said victim wire according to a range that can be taken by the respective dynamic signal arrival times on said victim wire and said plurality of aggressor wires, and adding said delay degradations of said plurality of aggressor wires together with reference to the signal arrival time on said victim wire.

5. A delay time calculation method of an electronic circuit device for calculating a delay time in the electronic circuit device which is realized by using an automatic designing apparatus comprising a processing unit, a memory unit and a man-machine interface and in which there are a plurality of aggressor wires inflicting crosstalk on a victim wire and determining signal delay degradation values due to the crosstalk in the electronic circuit device, the method comprising the following steps which are executed with a program held on the memory:

(a) a step of inputting connection information on a logic circuit block or a logic circuit cell for determining logical relationship between a logical input and a logical output and physical space information on wiring used for the connection, (b) a step of calculating, in figuring out a signal arrival time at at least one node in the logic circuit, a possible range of signal arrival at said at least one node, (c) a step of extracting a wire belonging to a victim node in said at least one node at the step (b) and aggressor wires from the physical space information on wiring inputted at the step (a) in accordance with a prescribed condition, (d) a step of calculating the delay degradation values at the victim node caused by the influence of said aggressor wires with use of the range of signal arrival time for the victim node obtained by executing the step (b), by executing the following substeps (d-1) through (d-4):

(d-1) a substep of holding the delay degradation values due to crosstalk with respect to combination of drivability of a drive circuit for said victim wire and drivability of a drive circuit for said aggressor wire extracted at the step (c) as a data form searchable at a relative time difference between signal arrival times of the victim node and the aggressor node, (d-2) a substep of calculating a range of signal arrival time at the node to which the aggressor wire extracted at the step (c) belongs, (d-3) a substep of converting the range of signal arrival time of the aggressor node calculated at the substep (d-2) into a range of relative signal arrival time with reference to the signal arrival time at the victim node, picking out a maximum one in the delay degradation values obtained at the substep (d-1) in the range of the relative signal arrival time, and holding it as a data form searchable at each signal arrival time at the victim node, and (d-4) a substep of adding mutually the delay degradation values held at the substep (d-1) every signal arrival time at the victim node for the combination of said victim wire and said aggressor wires, and holding the resultant sum as a delay degradation value of each signal arrival time at the victim node.

6. A logic circuit designing system comprising a processing unit, a memory unit and a man-machine interface, the designing system being characterized in that delay degradation quantity has been reduced by, after a delay time is calculated for a plurality of aggressor wires inflicting crosstalk on a victim wire, determining signal delay degradation values due to the crosstalk in a logic circuit, identifying modified parts in the logic circuit in accordance with a prescribed condition, altering a configuration of the logic circuit, an arrangement of the modified parts or positions of wires, and thereby varying a signal arrival time.

7. An electronic circuit device designing method for designing an electronic circuit device having a plurality of aggressor wires adjoining a victim wire, the designing method comprising the steps of:

determining respective delay degradations that said plurality of aggressor wire inflict on said victim wire according to ranges that can be taken by respective dynamic signal arrival times at a node of said victim wire and node of said plurality of aggressor wires, determining an overall delay degradation due to crosstalk that said plurality of aggressor wires inflict on said victim wire by integrating the delay degradations with reference to the signal arrival time on said victim wire thereby to calculate the total signal delay time at the node of said victim wire, and designing the electronic circuit device on the basis of the result of this calculation.

8. An electronic circuit device designing method for designing an electronic circuit device having a plurality of aggressor wires adjoining a victim wire, the designing method comprising the steps of:

using a design tool having a screen on which a graphic image expressing characteristic of the respective delay degradations that said plurality of aggressor wires inflict on said victim wire with reference to a signal arrival time on said victim wire according to ranges that can be taken by respective signal arrival times at a node of said victim wire and nodes of said plurality of aggressor wires and another graphic image integrating the delay degradations with reference to the signal arrival time on said victim wire are displayed, and analyzing characteristic of delay degradations due to crosstalk that said plurality of aggressor wires inflict on said victim wire node.

9. A recorded medium of an electronic circuit library, having stored in a computer-readable manner the electronic circuit library for use in calculating deploy degradation values due to a group of aggressor wires inflicting on a victim wire the electronic circuit library recording medium being characterized in that said library causes a computer to acquire delay degradation values according to differences between signal arrival times at nodes belonging to said aggressor wires and said victim wire in a case where there are a plurality of adjacent lengths of said aggressor wires and victim wire between which the crosstalk arises in regard to a combination of logical cells or logical blocks driving said victim wire and said aggressor wires and/or a combination of load drivability of the driving logical cells or the driving logical blocks.

10. A recorded medium of an electronic circuit library, having stored in a computer-readable manner the electronic circuit library for use in calculating delay degradation values due to a group of aggressor wires inflicting crosstalk on a victim wire the electronic circuit library recording medium being characterized in that said library causes a computer to acquire delay degradation values due to the crosstalk according to differences between signal arrival times at nodes belonging to said aggressor wires and said victim wire in regard to a combination of logical cells or logical blocks driving said victim wire and said aggressor wires and/or a combination of load drivability of the driving logical cells or the driving logical blocks, and acquire delay degradation values due to the crosstalk according to differences between signal arrival times at nodes belonging to said aggressor wires and said victim wire in a case where wiring is added to at least either of the closer side to and the farther side from the driving logical cells or driving logical blocks on a section where said victim wire and said aggressor wires are laid adjacent to each other.

11. An electronic circuit device manufacturing method for manufacturing an electronic circuit device having a plurality of aggressor wires by using the crosstalk calculation method wherein a second and a third aggressor wire inflict crosstalk on a first wire in the electronic circuit device, said second and said third aggressor wires being arranged adjacent to said first wire, said first wire being connected to an output section of a first electronic circuit unit, and said second and said third aggressor wires being connected to output sections of a second and a third electronic circuit unit respectively, the method comprising the steps of:

calculating a range of signal arrival time of each of said first wire and said second and said third aggressor wires on the basis of delay characteristics of signals in each of said first, said second and said third electronic circuit units, determining delay degradation values due to crosstalk affecting said first wire according to timings of signals arriving on said second and said third wires on the basis or relative signal arrival times obtained by relative measuring of signal arrival times on said second and third wires with reference to a signal arrival time on said first wire, and adding and said delay degradation values with reference to the signal arrival time on said first wire.

12. An electronic circuit device manufacturing method for manufacturing an electronic circuit device having a plurality of aggressor wires by using the crosstalk analysis method for analyzing signal crosstalk that the plurality of aggressor wires adjoining a victim wire inflict on said victim wire, the method comprising the steps of:

calculating a maximum value of delay degradation inflicted on said victim wire within a range of signal arrival time of each of said plurality of aggressor wires with reference to a signal arrival time on said victim wire for each of said aggressor wires, adding results of the step of calculating with reference to the signal arrival time on said victim wire, and determining total delay degradation inflicted on said victim wire by crosstalk from said plurality of aggressor wires.

* * * * *